(12) United States Patent
Snaith et al.

(10) Patent No.: US 10,622,162 B2
(45) Date of Patent: Apr. 14, 2020

(54) THIN FILM PRODUCTION

(71) Applicant: OXFORD UNIVERSITY INNOVATION LIMITED, Oxford (GB)

(72) Inventors: Henry James Snaith, Oxford (GB); Wei Zhang, Oxford (GB); Michael Saliba, Oxford (GB)

(73) Assignee: OXFORD UNIVERSITY INNOVATION LIMITED, Botley, Oxford (GB)

(*) Notice: Subject to any disclaimer, the term of this patent is extended or adjusted under 35 U.S.C. 154(b) by 0 days.

(21) Appl. No.: 15/502,082

(22) PCT Filed: Aug. 7, 2015

(86) PCT No.: PCT/GB2015/052293
§ 371 (c)(1),
(2) Date: Feb. 6, 2017

(87) PCT Pub. No.: WO2016/020699
PCT Pub. Date: Feb. 11, 2016

(65) Prior Publication Data
US 2017/0229249 A1 Aug. 10, 2017

(30) Foreign Application Priority Data

Aug. 8, 2014 (GB) .................................. 1414110.5

(51) Int. Cl.
H01L 51/00 (2006.01)
H01L 51/42 (2006.01)
H01G 9/20 (2006.01)

(52) U.S. Cl.
CPC ......... H01G 9/2009 (2013.01); H01L 51/001 (2013.01); H01L 51/0003 (2013.01);
(Continued)

(58) Field of Classification Search
None
See application file for complete search history.

(56) References Cited

U.S. PATENT DOCUMENTS

| 5,656,329 A | 8/1997 | Hampden-Smith et al. |
| 5,894,064 A | 4/1999 | Hampden-Smith et al. |
| 2005/0012182 A1 | 1/2005 | Jang et al. |

FOREIGN PATENT DOCUMENTS

| WO | 2014045021 A1 | 3/2014 |
| WO | 2014202965 A1 | 12/2014 |

OTHER PUBLICATIONS

Jeng et al., "CH3NH3PbI3 Perovskite/Fullerene Planar-Heterojunction Hybrid Solar Cells," 2013, Advanced Materials, 25, pp. 3727-3732.*

(Continued)

Primary Examiner — Bo B Jang
(74) Attorney, Agent, or Firm — Quarles & Brady LLP

(57) ABSTRACT

The present invention relates to a process for producing a layer of a crystalline material, which process comprises disposing on a substrate: a first precursor compound comprising a first cation and a sacrificial anion, which first cation is a metal or metalloid cation and which sacrificial anion comprises two or more atoms; and a second precursor compound comprising a second anion and a second cation, which second cation can together with the sacrificial anion form a first volatile compound. The invention also relates to a layer of a crystalline material obtainable by a process according to the invention. The invention also provides a process for producing a semiconductor device comprising a process for producing a layer of a crystalline material according to the invention. The invention also provides a composition comprising: (a) a solvent; (b) $NH_4X$; (c) AX; and (d) $BY_2$ or $MY_4$; wherein X, A, M and Y are as defined herein.

32 Claims, 14 Drawing Sheets

(52) U.S. Cl.
CPC ...... *H01L 51/0007* (2013.01); *H01L 51/0025* (2013.01); *H01L 51/0026* (2013.01); *H01L 51/0032* (2013.01); *H01L 51/4226* (2013.01); *H01L 51/4253* (2013.01); *Y02E 10/549* (2013.01); *Y02P 70/521* (2015.11)

(56) References Cited

OTHER PUBLICATIONS

Poglitsch et al. ("Dynamic disorder in methylammoniumtrihalogenoplumbates (II) observed by millimeter-wave spectroscopy" 1987, J. Chem. Phys. 87(11), pp. 6373-6378.*
Kojima et al., "Organometal Halide Perovskites as Visible-Light Sensitizers for Photovoltaic Cells," 2009, J. Am. Chem. Soc., 131, pp. 6050-6051. (Year: 2009).*
Ball, et al., Low-Temperature Processed Meso-Superstructured to Thin-Film Perovskite Solar Cells, Energy & Environmental Science, 2013, 6:1739-1743.
Buckingham, et al., Synthesis and Structures of Five [Co(Mecyclen)(S-AlaO)]2+ Isomers: Use of nOe and COSY 1H NMR Spectroscopy for Structural Assignment in Solution, Inorganic Chemistry, 1995, 34:3646-3657.
Buin, et al., Materials Processing Routes to Trap-Free Halide Perovskites, Nano Letters, 2014, 14:6281-6286.
Burschka, et al., Sequential Deposition as a Route to High-Performance Perovskite-Sensitized Solar Cells, Nature, 2013, 499:316-319.
Chen, et al., Planar Heterojunction Perovskite Solar Cells via Vapor-Assisted Solution Process, Journal of the American Chemical Society, 2014, 136:622-625.
Chi, et al., The Ordered Phase of Methylammonium Lead Chloride CH3ND3PbCl3, Journal of Solid State Chemistry, 2005, 178:1376-1385.
Colella, et al., MAPbI3-xClx Mixed Halide Perovskite for Hybrid Solar Cells: The Role of Chloride as Dopant on the Transport and Structural Properties, Chemistry of Materials, 2013, 25:4613-4618.
Conings, et al., Perovskite-Based Hybrid Solar Cells Exceeding 10% Efficiency with High Reproducibility Using a Thin Film Sandwich Approach, Advanced Materials, 2014, 26:2041-2046.
De Wolf, et al., Organometallic Halide Perovskites: Sharp Optical Absorption Edge and Its Relation to Photovoltaic Performance, Journal of Physical Chemistry Letters, 2014, 5:1035-1039.
Docampo, et al., Solution Deposition-Conversion for Planar Heterojunction Mixed Halide Perovskite Solar Cells, Advanced Energy Materials, 2014, 4:1400355, 6 pages.
Dualeh, et al., Effect of Annealing Temperature on Film Morphology of Organic-Inorganic Hybrid Pervoskite Solid-State Solar Cells, Advanced Functional Materials, 2014, 24(21):3250-3258.
Eperon, et al., Morphological Control for High Performance, Solution-Processed Planar Heterojunction Perovskite Solar Cells, Advanced Functional Materials, 2013, 24(1):151-157.
Eperon, et al., Neutral Color Semitransparent Microstructured Perovskite Solar Cells, ACS Nano, 2013, 8(1):591-598.
Gonzalez-Pedro, et al., General Working Principles of CH3NH3PbX3 Perovskite Solar Cells, Nano Letters, 2014, 14:888-893.
Green, et al., The Emergence of Perovskite Solar Cells, Nature Photonics, 2014, 8:506-514.
Haber, Manual on Catalyst Characterization, Pure & Appl. Chem., 1991, 63(9):1227-1246.
Haslam, et al., The Determination of Chlorine by the Oxygen Flask Combustion Method: A Single Unit for Electrical Ignition by Remote Control and Potentiometric Titration, Analyst, 1960, 85(1013):556-560.
Heo, et al., Efficient Inorganic-Organic Hybrid Heterojunction Solar Cells Containing Perovskite Compound and Polymeric Hole Conductors, Nature Photonics, 2013, 7(6):486-491.
Hodes, Perovskite-Based Solar Cells, Science, 2013, 342:317-318.
Jackson, et al., Photothermal Deflection Spectroscopy and Detection, Applied Optics, 1981, 20(8):1333-1344.
Jeon, et al., Solvent Engineering for High-Performance Inorganic-Organic Hybrid Perovskite Solar Cells, Nature Materials, 2014, 13:897-903.
Juarez-Perez, et al., Role of the Selective Contacts in the Performance of Lead Halide Perovskite Solar Cells, Journal of Physical Chemistry Letters, 2014, 5:680-685.
Kim, H., et al., Lead Iodide Perovskite Sensitized All-Solid-State Submicron Thin Film Mesoscopic Solar Cell with Efficiency Exceeding 9%, Scientific Reports, 2012, 2:591, 7 pages.
Kim, J., et al., The Role of Intrinsic Defects in Methylammonium Lead Iodide Perovskite, Journal of Physical Chemistry Letters, 2014, 5:1312-1317.
Kojima, et al., Organometal Halide Perovskites as Visible-Light Sensitizers for Photovoltaic Cells, J. Am. Chem. Soc., 2009, 131:6050-6051.
Lee, et al., Efficient Hybrid Solar Cells Based on Meso-Superstructured Organometal Halide Perovskites, Science, 2012, 338:643-647.
Liu, D., et al., Perovskite Solar Cells with a Planar Heterojunction Structure Prepared Using Room-Temperature Solution Processing Techniques, Nature Photonics, 2014, 8:133-138.
Liu, M., et al., Efficient Planar Heterojunction Perovskite Solar Cells by Vapour Deposition, Nature, 2013, 501:395-398.
Malinkiewicz, et al., Perovskite Solar Cells Employing Organic Charge-Transport Layers, Nature Photonics, 2014, 8:128-132.
Moore, et al., Impact of the Organic Halide Salt on Final Perovskite Composition for Photovoltaic Applications, APL Materials, 2014, 2:081802-1 thru 081802-7.
Moore, et al., Crystallization Kinetics of Organic-Inorganic Trihalide Perovskites and the Role of the Lead Anion in Crystal Growth, Journal of the American Chemical Society, 2015, 137:2350-2358.
Mosconi, et al., First-Principles Investigation of the TiO2/Organohalide Perovskites Interface: The Role of Interfacial Chlorine, Journal of Physical Chemistry Letters, 2014, 5:2619-2625.
Noh, et al., Chemical Management for Colorful, Efficient, and Stable Inorganic-Organic Hybrid Nanostructured Solar Cells, Nano Letters, 2013, 13(4):1764-1769.
Ogomi, et al., CH3NH3SnxPb(1-x)I3 Perovskite Solar Cells Covering Up to 1060 nm, Journal of Physical Chemistry Letters, 2014, 5:1004-1011.
Pellet, et al., Mixed-Organic-Cation Perovskite Photovoltaics for Enhanced Solar-Light Harvesting, Angew. Chem. Int. Ed., 2014, 53:3151-3157.
Poglitsch, et al., Dynamic Disorder in Methylammonlumtrihalogenoplumbates (II) Observed by Millimeter-Wave Spectroscopy, J. Chem. Phys., 1987, 87(11):6373-6378.
Rouquerol, et al., Recommendations for the Characterization of Porous Solids, Pure & Appl. Chem., 1994, 66(8):1739-1758.
Sing, et al., Reporting Physisorption Data for Gas/Solid Systems with Special Reference to the Determination of Surface Area and Porosity, Pure & Appl. Chem., 1985, 57(4):603-619.
Snaith, et al., Anomalous Hysteresis in Perovskite Solar Cells, Journal of Physical Chemistry Letters, 2014, 5:1511-1515.
Stranks, et al., Electron-Hole Diffusion Lengths Exceeding 1 Micrometer in an Organometal Trihalide Perovskite Absorber, Science, 2013, 342:341-344.
Suarez, et al., Recombination Study of Combined Halides (Cl, Br, I) Perovskite Solar Cells, Journal of Physical Chemistry Letters, 2014, 5:1628-1635.
Urbach, The Long-Wavelength Edge of Photographic Sensitivity and of the Electronic Absorption of Solids, Physical Review, 1953, 92(5):1324.
Xing, et al., Long-Range Balanced Electron- and Hole-Transport Lengths in Organic-Inorganic CH3NH3PbI3, Science, 2013, 342:344-347.
You, et al., Low-Temperature Solution-Processed Perovskite Solar Cells with High Efficiency and Flexibility, ACS Nano, 2014, 8(2):1674-1680.
Zhao, et al., CH3NH3Cl-Assisted One-Step Solution Growth of CH3NH3PbI3: Structure, Charge-Carrier Dynamics, and Photovoltaic

(56) References Cited

OTHER PUBLICATIONS

Properties of Perovskite Solar Cells, Journal of Physical Chemistry, 2014, 118:9412-9418.

* cited by examiner

THIN FILM PRODUCTION

CROSS-REFERENCE TO RELATED APPLICATIONS

This application represents the national stage entry of PCT International Application No. PCT/GB2015/052293 filed Aug. 7, 2015 and claims priority to British Patent Application No. 1414110.5 filed Aug. 8, 2014, 2014. The contents of this application are hereby incorporated by reference as if set forth in their entirety herein.

FIELD OF THE INVENTION

The present invention relates to a process for producing a layer of a crystalline material. The layer of crystalline material thus produced can be useful in the manufacture of semiconductor devices, for instance photovoltaic devices. A process for producing a semiconductor device is also described.

The work leading to this invention has received funding from the European Research Council under the European Community's Seventh Framework Programme (FP7/2007-2013)/ERC grant agreement no 279881.

BACKGROUND TO THE INVENTION

Layers and thin films of crystalline materials are important in a wide number of applications including glazing, electronics and photovoltaics. It is often important that such layers are smooth and free of holes or defects. Furthermore, it is desirable to be able to produce such layers quickly, easily and with minimal expense. Layers and thin films are typically produced by vapour deposition or solution deposition. Both processes can have inherent difficulties.

Solution processing is a promising technology for production of layers of crystalline materials. As compared to vapour deposition, solution processing is generally applicable to large-scale substrates, easily transferable to reel-to-reel printing and cheaper than vacuum techniques. Well-known solution based techniques include graveur coating, slot dye coating, screen printing, ink jet printing, doctor blade coating, spray coating and spin-coating. However, there are still problems associated with known solution coating techniques and the precursor solutions used in these solution based techniques. In particular, conventional precursor solutions used in solution processing of crystalline materials often require long anneal times for film formation. This both slows the production of the layers of crystalline materials and also increases the associated costs due to greater energy requirements. Furthermore, films produced by solution coating often have surfaces which are too rough for practical application to thin film optoelectronic devices.

One area in which the efficient and effective production of thin films of crystalline materials is of great importance is optoelectronics and photovoltaics. For instance, perovskite solar cells, which have demonstrated great promise for photovoltaic technology with the lowest cost and highest efficiency, often require high quality films of the crystalline materials perovskite. Through rational device architecture design, materials interface engineering, as well as processing technique optimization, a recorded efficiency around 18% has been attained for organic-inorganic metal halide perovskites, showing great potential for commercialization to compete with traditional crystalline silicon solar cells. Although the device performance of perovskite solar cells has improved at an unprecedented rate over recent years, the basic properties of organic-inorganic metal halide perovskites, for instance $CH_3NH_3PbX_3$ where X=Cl, Br, I (which is also referred to herein as $MAPbX_3$), such as the role of cation and anion, are still not well understood. Most research focuses on tuning the perovskite band gap by changing the ratio of either anions ($Br^-$ to $I^-$) or cations (formamidinium (FA) to methylammonium (MA)). Known methods for producing layers of organic-inorganic metal halide perovskite materials typically comprise solution- or vacuum-processing a metal halide and a halide salt of the organic component, for instance $PbI_2$ and $CH_3NH_3I$ (MAI).

It has become apparent that the quality and form of the film of perovskite used in organic-inorganic metal halide perovskite solar cells is of great importance for device efficiency. There is a need for a new approach to form high quality, smooth and substantially pinhole-free thin films of crystalline materials. It is also desirable to provide an efficient and scalable process by which to produce such films.

SUMMARY OF THE INVENTION

The inventors have developed a new approach to the solution processing of films of a crystalline material which surmounts the problems associated with solution processing such as pinholes, roughness and annealing time. Surprisingly the inventors have found that by including a sacrificial anion in the precursor solution for film production, the rate of film formation and quality of the resulting films is greatly improved. In particular, it has been found that using a first precursor compound comprising a metal or metalloid cation and a first sacrificial anion which comprises at least two atoms allows for unexpectedly improved film formation. The sacrificial anion does not typically form part of the crystalline material and acts to bring about substantial improvement in film formation.

In the context of layers of organic-inorganic metal halide perovskites, the problems with known methods have be solved by the inventors by using a metal salt such as lead acetate, where the acetate is a sacrificial anion, rather than known metal precursors such as lead halides. The film formation for perovskite materials can take as little as 5 minutes when using the process of the invention rather than known processes which can require several hours of annealing time. The film smoothness is improved by the process of the invention and even exceeds evaporated films where was previously the smoothest means to make polycrystalline thin films. The invention provides a new synthesis method for highly smooth films of crystalline materials, for instance perovskites, which form in a very short time. As such, the device performance based on the new precursor combination of the invention outperforms the conventional precursors used for solution coating and is even comparable to that from vapour-deposition but in a much quicker and cheaper way. The decreased anneal time can also decrease production costs. This is a very important factor since, for instance in a glass coating manufacturing line, the time each glass sheet would ideally spend at each stage in the manufacturing is between 45 to 60 seconds. If the thin film crystallisation takes 60 minutes then over 60 parallel stages would be required to anneal the films in order to sustain the fast throughput rate. For a solution processing line this would amount to a significant fraction of the capital expenditure, and the space required for manufacture. If this annealing time can be reduced to 5 minutes then only around 5 parallel annealing stages would be required. Ideally any individual step in the manufacturing would take no longer than 45 seconds.

Thus the invention provides a process for producing a layer of a crystalline material, which process comprises disposing on a substrate:
- a first precursor compound comprising a first cation and a sacrificial anion, which first cation is a metal or metalloid cation and which sacrificial anion comprises two or more atoms; and
- a second precursor compound comprising a second anion and a second cation.

Typically, the second cation can together with the sacrificial anion form a first volatile compound.

The inventors have found that the process of the invention may be further improved by incorporating a further precursor compound comprising a second sacrificial cation. The invention therefore also provides a process according to the invention, which process comprises disposing on the substrate:
- said first precursor compound;
- said second precursor compound; and
- a third precursor compound comprising a sacrificial cation, which sacrificial cation comprises two or more atoms and has a lower molecular weight than the second cation.

Typically, the sacrificial cation can together with the sacrificial anion form a second volatile compound.

The invention also provides a layer of a crystalline material obtainable by a process for producing a layer of a crystalline material according to the invention.

The invention also provides a process for producing a semiconductor device comprising a layer of a crystalline material, which process comprises producing said layer of a crystalline material by a process for producing a layer of a crystalline material according to the invention.

The invention also provides a semiconductor device obtainable by a process for producing a layer of a crystalline material according to the invention.

In addition to the process of the invention, the inventors have also developed a composition which is useful in the production of layers of crystalline materials. The invention therefore also provides a composition comprising:
(a) a solvent;
(b) $NH_4X$;
(c) AX; and
(d) $BY_2$ or $MY_4$;
wherein
each X is independently $I^-$, $Br^-$, $Cl^-$ or $F^-$;
A is $Li^+$, $Na^+$, $K^+$, $Rb^+$, $Cs^+$, $(NR^1_4)^+$ or $(H_2N-C(R^1)=NH_2)^+$, wherein each $R^1$ is independently selected from H and an unsubstituted $C_{1-6}$ alkyl group;
B is $Cu^{2+}$, $Pb^{2+}$, $Ge^{2+}$, $Sn^{2+}$, $Fe^{2+}$ or $Zn^{2+}$;
M is $Sn^{4+}$, $Pb^{4+}$, $Ge^{4+}$ or $Te^{4+}$; and
Y is an anion of formula $RCOO^-$ or $NO_3^-$ wherein R is H or unsubstituted $C_{1-6}$ alkyl.

DETAILED DESCRIPTION OF THE INVENTION

Definitions

Figure 1:
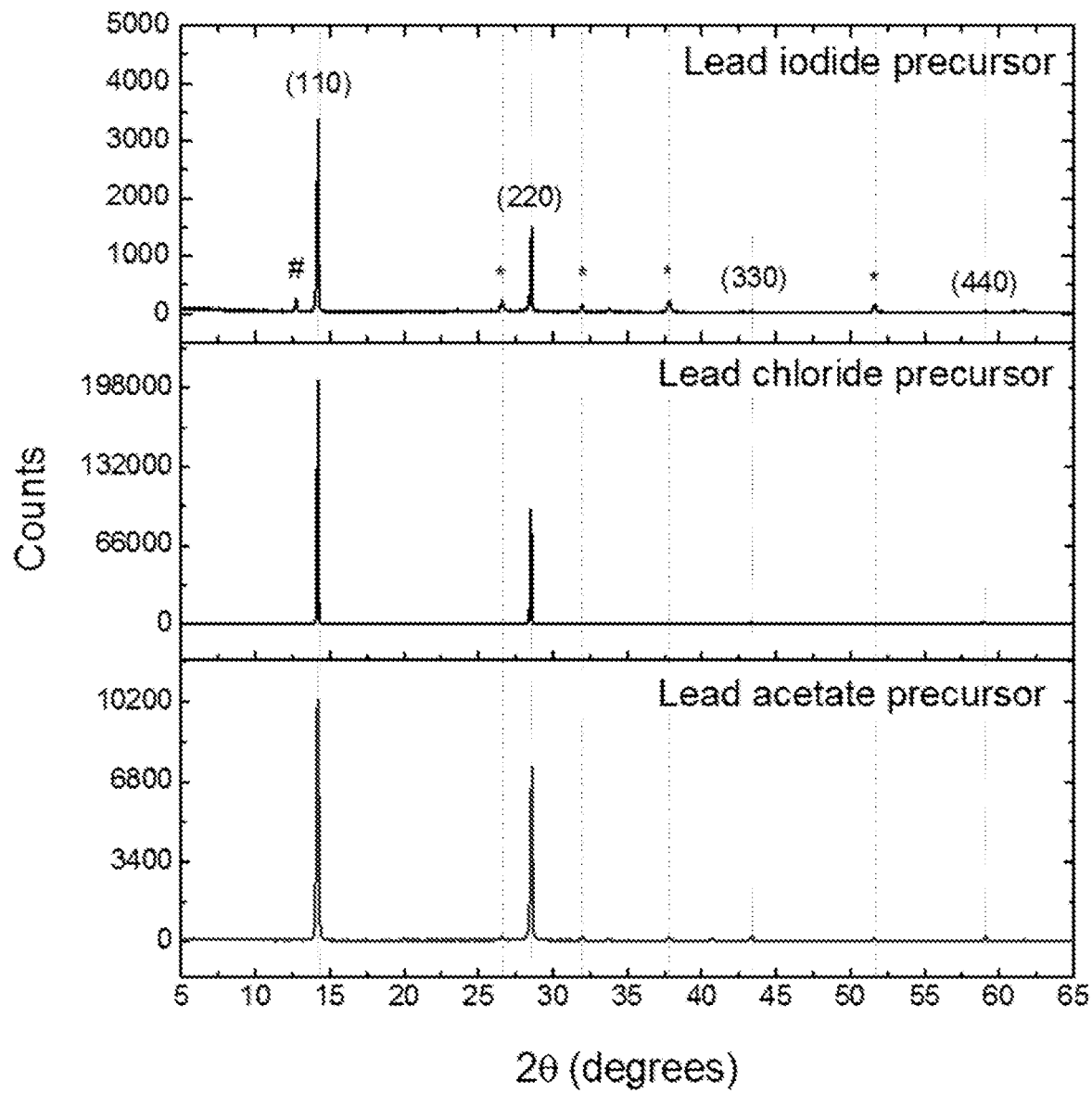
FIG. 1 shows the X-ray diffraction spectra for perovskite films deposited on a FTO/c-$TiO_2$ (compact-$TiO_2$) substrate from the three different lead precursor solutions of 3 molar equivalent of $CH_3NH_3I$ with one molar equivalent of: lead (II) iodide ($PbI_2$, upper), lead (II) chloride ($PbCl_2$, middle), and lead (II) acetate ($PbAc_2$, lower).

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion. The term "organic-inorganic metal halide perovskites", as used herein, refers to a metal halide perovskite, the formula of which contains at least one organic cation.

The term "hexahalometallate", as used herein, refers to a compound which comprises an anion of the formula $[MX_6]^{n-}$ wherein M is a metal atom, each X is independently a halide anion and n is an integer from 1 to 4.

The term "chalcogenide" refers to anions of the elements of group 16, for instance $O^{2-}$, $S^{2-}$, $Se^{2-}$, or $Te^{2-}$. Typically, the chalcogenides are taken to be $S^{2-}$, $Se^{2-}$, and $Te^{2-}$.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "alkenyl", as used herein, refers to a linear or branched chain hydrocarbon radical comprising one or more double bonds. An alkenyl group may be a $C_{2-20}$ alkenyl group, a $C_{2-14}$ alkenyl group, a $C_{2-10}$ alkenyl group, a $C_{2-6}$ alkenyl group or a $C_{2-4}$ alkenyl group. Examples of a $C_{2-10}$ alkenyl group are ethenyl (vinyl), propenyl, butenyl, pentenyl, hexenyl, heptenyl, octenyl, nonenyl or decenyl. Examples of $C_{2-6}$ alkenyl groups are ethenyl, propenyl, butenyl, pentenyl or hexenyl. Examples of $C_{2-4}$ alkenyl groups are ethenyl, propenyl, n-propenyl, s-butenyl or n-butenyl. Alkenyl groups typically comprise one or two double bonds.

The term "alkynyl", as used herein, refers to a linear or branched chain hydrocarbon radical comprising one or more triple bonds. An alkynyl group may be a $C_{2-20}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl or decynyl. Examples of $C_{1-6}$ alkynyl groups are ethynyl, propynyl, butynyl, pentynyl or hexynyl. Alkynyl groups typically comprise one or two triple bonds.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The terms "alkylene", "cycloalkylene", "alkenylene", "alkynylene", and "arylene", as used herein, refer to bivalent groups obtained by removing a hydrogen atom from an alkyl, cycloalkyl, alkenyl, alkynyl, or aryl group, respectively. An alkylene group may be a $C_{1-18}$ alkylene group, a $C_{1-14}$ alkylene group, a $C_{1-10}$ alkylene group, a $C_{1-6}$ alkylene group or a $C_{1-4}$ alkylene group. Examples of $C_{1-6}$ alkylene groups are methylene, ethylene, propylene, butylene, pentylene and hexylene. A cycloalkylene group may be a $C_{3-10}$ cycloalkylene group, a $C_{3-8}$ cycloalkylene group or a $C_{3-6}$ cycloalkylene group. Examples of $C_{3-6}$ cycloalkylene groups include cyclopentylene and cyclohexylene. An alkenylene group may be a $C_{2-18}$ alkenylene group, a $C_{2-14}$ alkenylene group, a $C_{2-10}$ alkenylene group, a $C_{2-6}$ alkenylene group or a $C_{2-4}$ alkenylene group. Examples of a $C_{2-4}$ alkenylene group include ethenylene (vinylene), propenylene and butenylene. An alkynylene group may be a $C_{2-18}$ alkynylene group, a $C_{2-14}$ alkynylene group, a $C_{2-10}$ alkynylene group, a $C_{2-6}$ alkynylene group or a $C_{2-4}$ alkynylene group. Examples of a $C_{2-4}$ alkynylene group include ethynylene and propynylene. Examples of arylene groups include phenylene and a diradical derived from thiophene. For alkylene, cycloalkylene, alkenylene, alkynylene, and arylene, these groups may be bonded to other groups at any two positions on the group. Thus, propylene includes $CH_2CH_2CH_2$— and $CH_2CH(CH_3)$—, and phenylene includes ortho-, meta- and para-phenylene.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K. S. W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "semiconductor device", as used herein, refers to a device comprising a functional component which comprises a semiconductor material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, or a light-emitting diode. The term "optoelectronic device", as used herein, refers to devices which source, control or detect light. Light is understood to include any electromagnetic radiation. Examples of optoelectronic devices include photovoltaic devices, photodiodes (including solar cells), phototransistors, photomultipliers, photoresistors, and light emitting diodes.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "volatile compound", as used herein, refers to a compound which is easily removed by evaporation or decomposition. For instance a compound which is easily removed by evaporation or decomposition at a temperature of less than or equal to 150° C., or for instance at a temperature of less than or equal to 100° C., would be a volatile compound. "Volatile compound" also includes compounds which are easily removed by evaporation via decomposition products. Thus, a volatile compound X may evaporate easily thorough evaporation of molecules of X, or a volatile compound X may evaporate easily by decomposing to form two compounds Y and Z which evaporate easily. For instance, ammonium salts can be volatile compounds, and may either evaporate as molecules of the ammonium salt or as decomposition products, for instance ammonium and a hydrogen compound (e.g. a hydrogen halide). Thus, a volatile compound X may have a relatively high vapour pressure (e.g. greater than or equal to 500 Pa) or may have a relatively high decomposition pressure (e.g. greater than or equal to 500 Pa for one or more of the decomposition products), which may also be referred to as a dissociation pressure.

Process for Producing a Layer of a Crystalline Material

The invention provides a process for producing a layer of a crystalline material, which process comprises disposing on a substrate: a first precursor compound comprising a first cation and a sacrificial anion, which first cation is a metal or metalloid cation and which sacrificial anion comprises two or more atoms; and a second precursor compound comprising a second anion and a second cation. Each of the first cation, the sacrificial anion, the second cation and the second anion may be as described herein. Usually, the second cation can together with the sacrificial anion form a first volatile compound.

The sacrificial anion and the second cation can often together form a first volatile compound. Thus, the compound $A_aY_y$, where A is the second cation, Y is the sacrificial anion and a and y are integers is usually a volatile compound. As discussed herein, volatile compounds are those compounds which are removed easily by evaporation, whether by evaporation of the compound itself or by evaporation of decomposition products from the compound.

Typically, the second cation and sacrificial anion do together form a first volatile compound. Thus, the process may further comprise allowing the second cation and the sacrificial anion to form a first volatile compound and allowing the first volatile compound to be removed from the composition disposed on the substrate. The first volatile compound may be allowed to be removed from the composition disposed on the substrate by allowing the first volatile compound to evaporate, decompose, or evaporate and decompose. Thus, allowing the first volatile compound to be removed may comprise heating the substrate or exposing the composition disposed on the substrate. Often, the substrate and/or composition is heated to remove the first volatile compound.

Typically, the first volatile compound is more volatile than a compound which consists of the second cation and the second anion. Whether one compound is more volatile than another is easily measured. For instance, thermogravimetric analysis may be performed and the compound which loses certain mass (for instance 5% mass) at the lower temperature is the more volatile. Often, the temperature at which the first volatile compound (comprising the second cation and the sacrificial anion) has lost 5% mass (following heating from room temperature, e.g. 20° C.) is more than 25° C. less than the temperature at which a compound which consists of the second cation and the second anion has lost 5% mass (following heating from room temperature, e.g. 20° C.). For instance, if a compound which consists of the second cation and the second anion (e.g. methylammonium iodide) has lost 5% mass at a temperature of 200° C., the first volatile compound (for instance methylammonium acetate) has typically lost 5% mass at a temperature of 175° C. or lower.

First Precursor Compound

The first precursor compound comprises a first cation and a sacrificial anion. The first precursor compound may comprise further cations or anions. The first precursor compound may consist of one or more of the first cations and one or more of the sacrificial anions.

The sacrificial anion comprises two or more atoms. The sacrificial anion is typically a monoanion (i.e. single negative charge). The two or more atoms may be the same atoms or different atoms. The negative charge may be localised onto one atom within the sacrificial anion or may be spread over two or more atoms in a delocalised arrangement. The two or more atoms are typically bonded by covalent bonds. The sacrificial anion is typically an anion derived from a molecule (for instance by deprotonation). Typically, the two or more atoms are different atoms. Typically, one of the two or more atoms is a carbon atom. Alternatively, one of the two or more atoms may be selected from a sulphur atom, a phosphorous atom or a nitrogen atom. Often, one of the one or more atoms is an oxygen atom. The sacrificial anion often comprises one or more carbon atoms, one or more hydrogen atoms, and one or more oxygen atoms. If an oxygen atom is present, the negative charge is often at least partially localised on this oxygen atom. For instance, the sacrificial anion may comprise one or more carbon atoms and one or more oxygen atoms. Often, the sacrificial anion is an organic anion. Organic anions include those derived from any organic compound, where organic compounds typically comprise at least one hydrogen atom bonded to a carbon atom. However, in some cases, organic anions may include those which comprise a carbon atom and no hydrogen atoms, for instance carbonate ($CO_3^{2-}$) or $CCl_3^-$.

Typically, the sacrificial anion is an organic anion. Organic anions are those obtained from organic compounds, for instance by deprotonation. The sacrificial anion is preferably an organic anion having a molecular weight of less than or equal to 500 gmol$^{-1}$. For instance the sacrificial anion may be an organic cation having a molecular weight of less than or equal to 250 gmol$^{-1}$ or less than or equal to 150 gmol$^{-1}$. Examples of organic anions include carboxylates, alkylcarbonates, alkylsulfonates, alkylphosphates, alkoxides and thiolates.

Typically, the sacrificial anion is an organic anion of formula $RCOO^-$, $ROCOO^-$, $RSO_3^-$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl.

For instance R may be H, substituted or unsubstituted $C_{1-10}$ alkyl, substituted or unsubstituted $C_{3-10}$ cycloalkyl or substituted or unsubstituted aryl. Typically R is H substituted or unsubstituted $C_{1-6}$ alkyl or substituted or unsubstituted aryl. For instance, R may be H unsubstituted $C_{1-6}$ alkyl or unsubstituted aryl. Thus, R may be selected from H, methyl, ethyl, propyl, butyl, pentyl, hexyl, cyclopentyl, cyclohexyl and phenyl.

Often, the sacrificial anion is a compound of formula $RCOO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl. For instance, R may be H unsubstituted $C_{1-6}$ alkyl or unsubstituted aryl.

Typically, the sacrificial anion is formate, acetate, propanoate, butanoate, pentanoate or benzoate.

Preferably the sacrificial anion is formate, acetate, propanoate or benzoate. More preferably the sacrificial anion is formate or acetate. Most preferably, the sacrificial anion is acetate.

In one embodiment, the process for producing a layer of a crystalline material may comprises disposing on a substrate: a first precursor compound comprising a first cation and a sacrificial anion, which first cation is a metal or a metalloid cation and which sacrificial anion is an organic anion comprising a carboxylate group (e.g. of formula $RCOO^-$); and a second precursor compound comprising a second anion and a second cation, which second cation can together with the sacrificial anion form a first volatile compound.

The first precursor compound comprises a first cation which is a metal or metalloid cation. The metal or metalloid cation may be a cation derived from any metal in groups 1 to 16 of the periodic table of the elements. The metal or metalloid cation may be any suitable metal or metalloid cation. The metal or metalloid cation may be a monocation, a dication, a trication or a tetracation. The metal or metalloid cation is typically a dication or a tetracation.

Metalloids are usually taken to be following elements: B, Si, Ge, As, Sb, Te and Po. The first cation is often a metal dication, trication or tetracation. Preferably, the first cation is a metal or metalloid dication, for instance in metal dication.

Typically, the metal or metalloid cation is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$. Preferably, the metal or metalloid cation is $Cu^{2+}$, $Pb^{2+}$, $Ge^{2+}$ or $Sn^{2+}$. Often, the first cation is a metal or metalloid cation which is $Pb^{2+}$ or $Sn^{2+}$.

Often, the first precursor compound consists of the first cation and the sacrificial anion. Accordingly, the first precursor compound can be a compound of formula $B_bY_y$, wherein B is a first cation as described herein, Y is a sacrificial anion as described herein, and b and y are each integers from 1 to 5.

Typically, the first precursor compound is a compound of formula $BY_2$ or $MY_4$, wherein B is said first cation which is a metal or metalloid dication, M is said first cation which is a metal or metalloid tetracation, and Y is said sacrificial anion.

Often, the first precursor compound is a lead salt or a tin salt. Thus the first precursor compound may be a compound of formula $PbY_2$, $PbY_4$, $SnY_2$ or $SnY_4$ wherein Y is a sacrificial anion as described herein. Often, the first precursor compound is a carboxylate salt of a metal, for instance lead or tin. The first precursor compound may be a compound of formula $Pb(RCOO)_2$ or $Sn(RCOO)_2$ where R is described above.

Typically, the first precursor compound is lead (II) acetate, lead (II) formate, lead (II) propanoate, tin (II) formate, tin (II) acetate or tin (II) propanoate.

Second Precursor Compound

The second precursor compound comprises a second anion and a second cation. The second anion and second cation may be any suitable ions. For instance the second cation may be a metal or metalloid cation or an organic cation. For instance the second cation may be a cation selected from $Li^+$, $Na^+$, $K^+$, $Rb^+$, $Cs^+$, $Cu^+$, $Pd^+$, $Pt^+$, $Ag^+$, $Au^+$, $Rh^+$, $Ru^+$, and an organic cation. For instance the second cation may be a cation selected from $Li^+$, $Na^+$, $K^+$, $Rb^+$, $Cs^+$ and an organic cation. The second cation is often a monocation, for instance a metal or metalloid monocation or an organic monocation.

Typically, the second cation is an organic cation. The second cation may be any suitable organic cation. The organic cation may be a cation derived from an organic compound, for instance by protonation. The second cation may be an organic monocation or an organic dication. The second cation is typically an organic monocation. The second cation typically has a molecular weight of less than or equal to 500 $gmol^{-1}$. Preferably, the second cation has a molecular weight of less than or equal to 250 $gmol^{-1}$ or less than or equal to 150 $gmol^{-1}$. Often, the second cation is an organic cation comprising a nitrogen atom or a phosphorous atom. For instance, the organic cation may comprise a quaternary nitrogen atom.

Typically, the second cation is $(NR^1R^2R^3R^4)^+$, $(R^1R^2N=CR^3R^4)^+$, $(R^1R^2N-C(R^5)=NR^3R^4)^+$ or $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, the second cation is selected from $(R^1NH_3)^+$, $(NR^2_4)^+$, and $(H_2N-C(R^1)=NH_2)^+$, wherein $R^1$ is H, a substituted or unsubstituted $C_{1-20}$ alkyl group or a substituted or unsubstituted aryl group, and each $R^2$ is independently H, or a substituted or unsubstituted $C_{1-10}$ alkyl group. Often, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl. For instance, the second cation may be selected from $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$.

Often, the second cation is $(CH_3NH_3)^+$, $(CH_3CH_2NH_3)^+$ or $(CH_3CH_2CH_2NH_3)^+$. For instance, the second cation may be $(CH_3NH_3)^+$.

Typically, the second anion is a halide anion or a chalcogenide anion. The second anion may be a halide anion, i.e. $F^-$, $Cl^-$, $Br^-$ or $I^-$. Often, the second anion is $Cl^-$, $Br^-$ or $I^-$. The second anion may be a chalcogenide anion, for instance $O^{2-}$, $S^{2-}$, $Se^{2-}$ or $Te^{2-}$. Chalcogenide anions are typically selected from $S^{2-}$, $Se^{2-}$ or $Te^{2-}$. For instance, the second anion may be $Cl^-$, $Br^-$, $I^-$, $S^{2-}$, $Se^{2-}$ or $Te^{2-}$.

The second precursor compound is typically, a compound of formula AX, wherein A is said second cation and X is said second anion, which second anion is a halide anion. The second cation may be as defined herein. The second anion may be as defined herein.

The second precursor compound may, for instance, be selected from $(H_3NR^1)X$, $(NR^1R^2R^3R^4)X$, $(R_1R^2N=CR^3R^4)X$, $(R^1R^2N-C(R^5)=NR^3R^4)X$ and $(R^1R^2N-C(NR^5R^6)=NR^3R^4)X$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group, and X is $F^-$, $Cl^-$, $Br^-$, or $I^-$. Preferably the second precursor compound is $(H_3NR^1)X$, wherein $R^1$ is an unsubstituted $C_{1-6}$ alkyl group and X is $Cl^-$, $Br^-$, or $I^-$.

The one or more second precursor compounds may, for example, be selected from CsF, CsCl, CsBr, CsI, $NH_4F$, $NH_4Cl$, $NH_4Br$, $NH_4I$, $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ and $(H_2N-C(H)=NH_2)I$. Typically, the second precursor compounds is selected from $(CH_3NH_3)Cl$, $(CH_3NH_3)Br$, $(CH_3NH_3)I$, $(CH_3CH_2NH_3)Cl$, $(CH_3CH_2NH_3)Br$, $(CH_3CH_2NH_3)I$, $(N(CH_3)_4)Cl$, $(N(CH_3)_4)Br$, $(N(CH_3)_4)I$, $(H_2N-C(H)=NH_2)Cl$, $(H_2N-C(H)=NH_2)Br$ and $(H_2N-C(H)=NH_2)I$.

Often, the second precursor compound is $(CH_3NH_3)F$, $(CH_3NH_3)Cl$, $(CH_3NH_3)Br$, $(CH_3NH_3)I$, $(CH_3CH_2NH_3)F$, ($CH_3CH_2NH_3$)Cl, ($CH_3CH_2NH_3$)Br, ($CH_3CH_2NH_3$)I, (N($CH_3$)$_4$)F, (N($CH_3$)$_4$)Cl, (N($CH_3$)$_4$)Br, (N($CH_3$)$_4$)I, ($H_2N$—C(H)=$NH_2$)Cl, ($H_2N$—C(H)=$NH_2$)Br and ($H_2N$—C(H)=$NH_2$)I. Preferably, the second precursor compound is ($CH_3NH_3$)Cl, ($CH_3NH_3$)Br, ($CH_3NH_3$)I, ($CH_3CH_2NH_3$)Cl, ($CH_3CH_2NH_3$)Br or ($CH_3CH_2NH_3$)I.

Crystalline Material

The process of the invention may be used to produce layers of many different types of crystalline materials. The crystalline material may comprise one or more cations and one or more anions. The layer of the crystalline material may consist essentially of the crystalline material.

The sacrificial anion is present to drive the film formation and improve the resulting film. The sacrificial anion typically forms part of a first volatile compound which preferably evaporates during film formation. The sacrificial anion does not typically form part of the crystalline material. For instance, the formula for the crystalline material does not typically comprise the sacrificial anion. Thus, the layer of the crystalline material formed by a process of the invention does not usually comprise a large amount of the sacrificial anion. For instance, the layer of the crystalline material typically comprises less than or equal to 15 wt % of the sacrificial anion. The weight percentage is taken by taking the weight of the formed layer as a whole and calculating the percentage of that mass which is due to sacrificial anions in the layer.

Typically, the layer of the crystalline material comprises less than or equal to 5 wt % of the sacrificial anion. Often, the layer of the crystalline material comprises less than or equal to 2 wt % of the sacrificial anion, for instance less than or equal to 1 wt % or 0.1 wt % of the sacrificial anion.

The crystalline material typically comprises a compound comprising: said first cation which is a metal or metalloid cation; said second cation, which second cation is an organic cation; and the second anion which is a halide anion or a chalcogenide anion. Often, the crystalline material comprises a compound consisting of: said first cation which is a metal or metalloid cation; said second cation, which second cation is an organic cation; and the second anion which is a halide anion or a chalcogenide anion. The crystalline material typically comprises greater than or equal to 90% by weight of a compound comprising said first cation which is a metal or metalloid cation; said second cation, which second cation is an organic cation; and the second anion which is a halide anion or a chalcogenide anion. For instance the crystalline material may consist essentially of a compound described below, for instance a perovskite or a hexahalometallate.

Often the crystalline material comprises a ternary compound. Thus, the crystalline material may comprise a compound having a formula (I)

$$[A]_a[B]_b[C]_c \qquad (I)$$

wherein [A] is one or more of said second cations, [B] is one or more of said first cations, [C] is one or more or said second anions, a is an integer from 1 to 6, b is an integer from 1 to 6, and c is an integer from 1 to 18. a is often an integer from 1 to 3, b is often an integer from 1 to 3, and c is often an integer from 1 to 8.

The crystalline compound may therefore comprise a compound of formula (I)

$$[A]_a[B]_b[C]_c \qquad (I)$$

wherein:
[A] is one or more second cations such as those described herein, for instance one or more organic monocations;

[B] is one or more first cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Pb^{2+}$, $Cu^{2+}$, $Ge^{2+}$ and $Ni^{2+}$;

[C] is one or more second anions selected from $Cl^-$, $Br^-$, $I^-$, $O^{2-}$, $S^{2-}$, $Se^{2-}$, and $Te^{2-}$;

a is an integer from 1 to 3;
b is an integer from 1 to 3; and
c is an integer from 1 to 8.

If [A] is one cation (A), [B] is two cations ($B^1$ and $B^2$), and [C] is one anion (C), the crystalline material may comprise a compound of formula $A_a(B^1,B^2)_bC_c$. [A] may represent one, two or more A ions. If [A], [B] or [C] is more than one ion, those ions may be present in any proportion. For instance, $A_a(B^1,B^2)_bC_c$ includes all compounds of formula $A_aB^1_{by}B^2_{b(1-y)}C_c$ wherein y is between 0 and 1, for instance from 0.05 to 0.95. Such materials may be referred to as mixed ion materials.

Typically, the crystalline material comprises a perovskite or a hexahalometallate. Preferably the crystalline material comprises a perovskite. The crystalline material often comprises a metal halide perovskite. The crystalline material often comprises an organometal halide perovskite.

The crystalline material typically comprises:
a perovskite of formula (II):

wherein: [A] is at least one monocation; [B] is at least one metal or metalloid dication; and [X] is at least one halide anion;
or
a hexahalometallate of formula (III):

wherein: [A] is at least one monocation; [M] is at least one metal or metalloid tetracation; and [X] is at least one halide anion.

[A] comprises said second cation. [B] and/or [M] comprise said first cation. [X] comprises said second anion.

The crystalline material may comprise a perovskite of formula (II):

wherein:
[A] is at least one second cation as defined herein;
[B] is at least one metal cation, wherein [B] comprises at least one of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; and
[X] is at least one halide anion.

[A] may be at least one organic cation as described herein for the second cation. For instance, [A] may be one or more organic cations selected from $(NR^1R^2R^3R^4)^+$, $(R^1R^2N=CR^3R^4)^+$, $(R^1R^2N—C(R^5)=NR^3R^4)^+$ and $(R^1R^2N—C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ may be independently H, or an unsubstituted $C_{1-6}$ alkyl group. [A] may be one or more organic cations selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$ and $(H_2N—C(CH_3)=NH_2)^+$. [A] may be a single cation selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$ and $(H_2N—C(CH_3)=NH_2)^+$. A is often $(CH_3NH_3)^+$, $(CH_3CH_2NH_3)^+$ or $(CH_3CH_2CH_2NH_3)^+$.

[A] may be at least one metal or metalloid cation as described herein for the second cation. For instance, [A]

may be one or more organic cations selected from Cs⁺, Rb⁺, Cu⁺, Pd⁺, Pt⁺, Ag⁺, Au⁺, Rh⁺, and Ru⁺. [A] is often selected from Cs⁺ and Rb⁺, and is more preferably Cs⁺.

The crystalline material may comprises a perovskite of formula (II):

$$[A][B][X]_3 \quad (II)$$

wherein: [A] is at least one organic cation; [B] is at least one metal or metalloid dication; and [X] is at least one halide anion. [A] may then be at least one organic cation as described herein for the second cation.

In one embodiment, the perovskite is a perovskite compound of the formula (IIA):

$$AB[X]_3 \quad (IIA)$$

wherein: A is a monocation; B is a metal cation; and [X] is two or more different halide anions. Preferably, [X] is two or three different halide anions. More preferably, [X] is two different halide anions. The monocation and metal cation may be as defined above for the second cation and first cation respectively. For instance, A may be an organic cation.

The crystalline material may, for instance, comprise a perovskite compound of formula (IIC):

$$ABX_{3-x}X'_x \quad (IIC)$$

wherein: A is a monocation; B is a metal cation; X is a first halide anion; X' is a second halide anion which is different from the first halide anion; and x is from 0 to 3. Usually, x is from 0.05 to 0.95. For instance, x may be from 0.5 to 2.5, or from 0.75 to 2.25. Typically, x is from 1 to 2. A may be an organic cation.

Again, in formula (IIC), the monocation A and metal cation B may be as further defined hereinbefore for the second and first cations respectively. Thus the monocations A may be selected from any metal, metalloid or organic monocation described above. The metal cations B may be selected from divalent metal cations. For instance, the metal cations B may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. The metal cation B may be selected from $Sn^{2+}$, $Pb^{2+}$, $Cu^{2+}$, $Ge^{2+}$ and $Ni^{2+}$. Preferably, the metal cation B is $Sn^{2+}$, $Pb^{2+}$ or $Cu^{2+}$.

The crystalline material may comprise, or consist essentially of, a perovskite compound selected from $APbI_3$, $APbBr_3$, $APbCl_3$, $APbF_3$, $APbBr_xI_{3-x}$, $APbBr_xCl_{3-x}$, $APbI_xBr_{3-x}$, $APbI_xCl_{3-x}$, $APbCl_xBr_{3-x}$, $APbI_{3-x}Cl_x$, $ASnI_3$, $ASnBr_3$, $ASnCl_3$, $ASnF_3$, $ASnBrI_2$, $ASnBr_xI_{3-x}$, $ASnBr_xCl_{3-x}$, $ASnF_{3-x}Br_x$, $ASnI_xBr_{3-x}$, $ASnI_xCl_{3-x}$, $ASnF_{3-x}I_x$, $ASnCl_xBr_{3-x}$, $ASnI_{3-x}Cl_x$ and $ASnF_{3-x}Cl_x$, $ACuI_3$, $ACuBr_3$, $ACuCl_3$, $ACuF_3$, $ACuBrI_2$, $ACuBr_xI_{3-x}$, $ACuBr_xC_{3-x}$, $ACuF_{3-x}Br_x$, $ACuI_xBr_{3-x}$, $ACuI_xC_{3-x}$, $ACuF_{3-x}I_x$, $ACuCl_xBr_{3-x}$, $ACuI_{3-x}Cl_x$, and $ACuF_{3-x}Cl_x$ where x is from 0 to 3, and wherein A is a monocation as described herein or an ammonium cation. x may be from 0.05 to 2.96. For instance, x may be from 0.1 to 2.9, or from 0.5 to 2.5. In some cases, x is from 0.75 to 2.25, or from 1 to 2. A may be an organic cation.

The crystalline material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2. For instance, if the first cation is $Pb^{2+}$, the second cation is $CH_3NH_3^+$ and the second anion is $I^-$, then the crystalline material may comprise or consist essentially of $CH_3NH_3PbI_3$.

The crystalline material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

The crystalline material may comprise, or consist essentially of, a perovskite compound selected from $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnBr_xCl_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, where x is from 0.05 to 2.95. For instance, x may be from 0.5 to 2.5, from 0.75 to 2.25, or from 1 to 2.

The perovskite compound may be selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$. The perovskite may be $CH_3NH_3PbCl_2I$.

Preferably, the crystalline material comprises, or consist essentially of, a perovskite compound selected from $CH_3NH_3PbI_3$, $CH_3NH_3PbBr_3$, $CH_3NH_3PbCl_3$, $CH_3NH_3SnI_3$, $CH_3NH_3SnBr_3$, $CH_3NH_3SnCl_3$, $CH_3NH_3CuI_3$, $CH_3NH_3CuBr_3$, $CH_3NH_3CuCl_3$, $NH_4CuI_3$, $NH_4CuBr_3$, $NH_4CuCl_3$, $NH_4CuI_2Br$, $NH_4CuI_2Cl$, $NH_4CuBr_2Cl$, $NH_4CuCl_2Br$, $CH_3NH_3CuI_2Br$, $CH_3NH_3CuI_2Cl$, $CH_3NH_3CuBr_2Cl$, and $CH_3NH_3CuCl_2Br$. More preferably, the crystalline material comprises, or consist essentially of, a perovskite compound selected from $CH_3NH_3PbI_3$, $CH_3NH_3SnI_3$, $NH_4CuCl_2Br$, $CH_3NH_3CuCl_3$, and $CH_3NH_3CuCl_2Br$.

In the case of where the crystalline material comprises a perovskite, the process of the invention may be explained as follows. Processes for producing a perovskite compound can comprise reacting a monovalent metal halide or an organic halide (e.g. methylammonium iodide) with a divalent metal halide (for instance lead iodide). An excess of the monovalent metal halide/organic halide is often required, for instance 3 equivalents monovalent metal halide/organic halide to 1 equivalent metal halide. The following reaction scheme may apply.

$$3AX + BX_2 \rightarrow ABX_3 + 2AX$$

Here, A is a monocation, B is a divalent metal cation and X is a halide anion. The excess halide anion is thought to be lost as AX (for instance by evaporation). In this process, A may be an organic cation, such that AX is an organic halide.

The inventors have surprisingly found that the divalent metal compound may be optimised by the inclusion of a sacrificial anion which increases the volatility of the side product comprising the excess monocation. Thus, an example reaction scheme for the process of the invention when applied to perovskite layer production may be as follows.

$$3AX + BY_2 \rightarrow ABX_3 + 2AY$$

Here, A is a monocation, B is a divalent metal cation, X is a halide anion and Y is a sacrificial anion. $BY_2$ is the first precursor compound. AX is the second precursor compound. The first volatile compound, AY, produced is a volatile compound which may therefore easily evaporate or decompose to products which evaporate. AY is typically more volatile than AX. In this process, A may be an organic cation, such that AX is an organic halide.

The crystalline material may comprise a hexahalometallate of formula (III):

$$[A]_2[M][X]_6 \qquad (III)$$

wherein:
[A] is at least one monocation;
[M] is at least one metal or metalloid tetracation; and
[X] is at least one halide anion.

[A] is at least one monocation; [M] is at least one metal or metalloid tetracation; and X is at least one halide anion. In a mixed monocation hexahalometallate, [A] is at least two monocations; [M] is at least one metal or metalloid tetracation (and typically [M] is a single metal or metalloid tetracation); and [X] is at least one halide anion (and typically [X] is a single halide anion). In a mixed metal hexahalometallate, [A] is at least one monocation (and typically [A] is a single monocation); [M] is at least two metal or metalloid tetracations (for instance $Ge^{4+}$ and $Sn^{4+}$); and [X] is at least one halide anion (and typically [X] is a single halide anion). In a mixed halide hexahalometallate, [A] is at least one monocation (and typically [A] is a single monocation); [M] is at least one metal or metalloid tetracation (and typically [M] is a single metal tetra cation); and [X] is at least two halide anions, for instance $Br^-$ and $Cl^-$.

[A] may be at least one monocation selected from any suitable monocations, such as those described above for a perovskite. [A] is typically at least one monocation selected from $Li^+$, $Na^+$, $K^+$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single cation selected from $Li^+$, $Na^+$, $K^+$, $Rb^+$, $Cs^+$, $NH_4^+$ and monovalent organic cations. [A] is preferably at least one monocation selected from $Rb^+$, $Cs^+$, $NH_4^+$ and monovalent organic cations. For instance, [A] may be a single monocation selected from $Rb^+$, $Cs^+$, $NH_4^+$ and monovalent organic cations. In one embodiment, [A] may be at least one inorganic monocation selected from $Li^+$, $Na^+$, $K^+$, $Rb^+$, $Cs^+$ and $NH_4^+$. For instance, [A] may be a single inorganic monocation selected from $Li^+$, $Na^+$, $K^+$, $Rb^+$, $Cs^+$ and $NH_4^+$. In another embodiment, [A] may be at least one monovalent organic cation. For instance, [A] may be a single monovalent organic cation. [A] may comprise one or more cations as described for the second cation.

Preferably, [A] is a single type of cation, i.e. the hexahalometallate is a compound of formula $A_2[M][X]_6$. [A] may be a single monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$. Preferably, [A] is a single monocation selected from $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ and $(H_2N-C(CH_3)=NH_2)^+$. In one embodiment, [A] is $(CH_3NH_3)^+$. In another embodiment, [A] is $(H_2N-C(H)=NH_2)^+$.

[M] may comprise one or more suitable metal or metalloid tetracations. Metals include elements of groups 3 to 12 of the Periodic Table of the Elements and Ga, In, Tl, Sn, Pb, Bi and Po. Metalloids include Si, Ge, As, Sb, and Te. For instance, [M] may be at least one metal or metalloid tetracation selected from $Ti^{4+}$, $V^{4+}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. Typically, [M] is at least one metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$. For instance, [M] may be a single metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

Typically, [M] is at least one metal or metalloid tetracation selected from $Sn^{4+}$, $Te^{4+}$, $Ge^{4+}$ and $Re^{4+}$. In one embodiment [M] is at least one metal or metalloid tetracation selected from $Pb^{4+}$, $Sn^{4+}$, $Te^{4+}$, $Ge^{4+}$ and $Re^{4+}$. For instance, [M] may be at least one metal or metalloid tetracation selected from $Pb^{4+}$, $Sn^{4+}$, $Te^{4+}$ and $Ge^{4+}$. Preferably, [M] is at least one metal or metalloid tetracation selected from $Sn^{4+}$, $Te^{4+}$, and $Ge^{4+}$. As discussed above, the hexahalometallate compound may be a mixed-metal or a single-metal hexahalometallate.

Preferably, the hexahalometallate compound is a single-metal hexahalometallate compound. More preferably, [M] is a single metal or metalloid tetracation selected from $Sn^{4+}$, $Te^{4+}$, and $Ge^{4+}$. For instance, [M] may be a single metal or metalloid tetracation which is $Te^{4+}$. For instance, [M] may be a single metal or metalloid tetracation which is $Ge^{4+}$. Most preferably, [M] is a single metal or metalloid tetracation which is $Sn^{4+}$.

[X] may be at least one halide anion. [X] is therefore at least one halide anion selected from $F^-$, $Cl^-$, $Br^-$ and $I^-$. Typically, [X] is at least one halide anion selected from $Cl^-$, $Br^-$ and $I^-$. The hexahalometallate compound may be a mixed-halide hexahalometallate or a single-halide hexahalometallate. If the hexahalometallate is mixed, [X] is two, three or four halide anions selected from $F^-$, $Cl^-$, $Br^-$ and $I^-$. Typically, in a mixed-halide compound, [X] is two halide anions selected from $F^-$, $Cl^-$, $Br^-$ and $I^-$.

Typically, [A] is a single monocation and [M] is a single metal or metalloid tetracation. Thus, the crystalline material may, for instance, comprise a hexahalometallate compound of formula (IIIA)

$$A_2M[X]_6 \qquad (IIIA)$$

wherein: A is a monocation; M is a metal or metalloid tetracation; and [X] is at least one halide anion. [X] may be one, two or three halide anions selected from $F^-$, $Cl^-$, $Br^-$ and $I^-$, and preferably selected from $Cl^-$, $Br^-$ and $I^-$. In formula (IIIA), [X] is preferably one or two halide anions selected from $Cl^-$, $Br^-$ and $I^-$.

The crystalline material may, for instance, comprise, or consist essentially of, a hexahalometallate compound of formula (IIIB)

$$A_2MX_{6-y}X'_y \qquad (IIIB)$$

wherein: A is a monocation (i.e. the second cation); M is a metal or metalloid tetracation (i.e. the first cation); X and X' are each independently a (different) halide anion (i.e. two second anions); and y is from 0 to 6. When y is 0 or 6, the hexahalometallate compound is a single-halide compound. When y is from 0.01 to 5.99 the compound is a mixed-halide hexahalometallate compound. When the compound is a mixed-halide compound, y may be from 0.05 to 5.95. For instance, y may be from 1.00 to 5.00.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$, or $A_2ReBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ or $(H_2N-C(CH_3)=NH_2)^+$, for instance $Cs^+$, $NH_4^+$, or $(CH_3NH_3)^+$.

The hexahalometallate compound may typically be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, or $A_2SnBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

In another embodiment, the hexahalometallate compound is $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, or $A_2GeBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

The hexahalometallate compound may, for instance, be $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, or $A_2TeBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

Often, y will be from 1.50 to 2.50. For instance, y may be from 1.80 to 2.20. This may occur if the compound is produced using two equivalents of AX' and one equivalent of $MX_4$, as discussed below.

In some embodiments, all of the ions are single anions. Thus, the crystalline material may comprise, or consist essentially of, a hexahalometallate compound of formula (IV)

$$A_2MX_6 \quad \quad (IV)$$

wherein: A is a monocation; M is a metal or metalloid tetracation; and X is a halide anion. A, M and X may be as defined herein.

The hexahalometallate compound may be $A_2SnF_6$, $A_2SnCl_6$, $A_2SnBr_6$, $A_2SnI_6$, $A_2TeF_6$, $A_2TeCl_6$, $A_2TeBr_6$, $A_2TeI_6$, $A_2GeF_6$, $A_2GeCl_6$, $A_2GeBr_6$, $A_2GeI_6$, $A_2ReF_6$, $A_2ReCl_6$, $A_2ReBr_6$ or $A_2ReI_6$, wherein: A is $K^+$, $Rb^+$, $Cs^+$, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group. A may be as defined herein.

Preferably, the hexahalometallate compound is $Cs_2SnI_6$, $Cs_2SnBr_6$, $Cs_2SnBr_{6-y}I_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N-C(H)=NH_2)_2SnI_6$, $(H_2N-C(H)=NH_2)_2SnBr_6$, $(H_2N-C(H)=NH_2)_2SnBr_{6-y}I_y$, $(H_2N-C(H)=NH_2)_2SnCl_{6-y}I_y$, or $(H_2N-C(H)=NH_2)_2SnCl_{6-y}Br_y$, wherein y is from 0.01 to 5.99. y may be as defined herein. For example, the hexahalometallate compound may be $(CH_3NH_3)_2SnI_6$, $(CH_3NH_3)_2SnBr_6$, $(CH_3NH_3)_2SnCl_6$, $(H_2N-C(H)=NH_2)_2SnI_6$, $(H_2N-C(H)=NH_2)_2SnBr_6$ or $(H_2N-C(H)=NH_2)_2SnCl_6$. The hexahalometallate compound may be $Cs_2SnI_6$, $Cs_2SnBr_6$, $Cs_2SnCl_{6-y}Br_y$, $(CH_3NH_3)_2SnI_6$, $(CH_3NH_3)_2SnBr_6$, or $(H_2N-C(H)=NH_2)_2SnI_6$.

In one embodiment, the crystalline material comprises a compound of formula (V), which may for instance be a layered perovskite:

$$[A]_2[B][X]_4 \quad \quad (V)$$

wherein:
[A] is at least one monocation, which is typically an organic cation;
[B] is at least one metal or metalloid cation, which is typically a metal or metalloid dication; and
[X] is at least one halide anion.
[A], in the compound of formula (V), which is typically at least one organic cation, may be as further defined herein for the perovskite of formula (II).
[B] in the compound of formula (V), which is typically at least one metal or metalloid dication, may be as further defined herein for the perovskite of formula (II).
[X] in the compound of formula (V), which is at least one halide anion, may be as further defined herein for the perovskite of formula (II).

First Volatile Compound

The first volatile compound may evaporate or decompose and drive formation of the layer of the crystalline material.

The first volatile compound often has a vapour pressure of greater than or equal to 500 Pa at 20° C. or a dissociation pressure of greater than or equal to 500 Pa at 20° C. The first volatile compound may for instance have a vapour pressure of greater than or equal to 1000 Pa at 20° C. For instance, $NH_4Ac$ (ammonium acetate) has a vapour pressure of 1850 Pa at 20° C. Vapour pressures for compounds may be found in data tables. The dissociation pressure is defined as the vapour pressure of one or more of the decomposition products formed by decomposition (dissociation) of the first volatile compound. For instance, for an ammonium compound such as ammonium acetate which may decompose to form ammonia and acetic acid, the dissociation pressure may be measured as the vapour pressure of ammonia produced.

Typically, the first volatile compound is more volatile than methylammonium iodide. Thus, the first volatile compound often evaporates or decomposes at a lower temperature than methylammonium iodide. Evaporation or decomposition may be measured by thermogravimetric analysis, for instance by measuring the temperature at which 5% mass has been lost.

Typically, the first volatile compound has an initial thermal decomposition temperature where 5 wt % weight is lost of less than or equal to 250° C. For instance, the first volatile compound may have an initial thermal decomposition temperature (where 5 wt % weight is lost) of less than or equal to 200° C., or less than equal to 180° C.

Typically, the first volatile compound is a compound of formula AY, wherein A is said second cation, which second cation is $(NR^1R^2R^3R^4)^+$, $(R^1R^2N=CR^3R^4)^+$, $(R^1R^2N-C(R^5)=NR^3R^4)^+$ or $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group, and Y is said sacrificial anion, which sacrificial anion is an anion of formula $RCOO^-$, $ROCOO^-$, $RSO_3^-$, $ROP(O)(OH)O^-$ or $RO^-$, and R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl.

For instance, the first volatile compound may be a compound of formula AY, wherein A is said second cation, which second cation is $(R^1NH_3)^+$, $(NR^2_4)^+$ or $(H_2N-C(R^1)=NH_2)^+$, wherein $R^1$ is H or an unsubstituted $C_{1-6}$ alkyl group and each $R^2$ is independently an unsubstituted $C_{1-6}$ alkyl group, and Y is said sacrificial anion, which sacrificial anion is an anion of formula $RCOO^-$, wherein R is H or unsubstituted $C_{1-6}$ alkyl.

For instance, the first volatile compound may be ammonium formate, ammonium acetate, ammonium propanoate, ammonium butanoate, ammonium pentanoate, ammonium hexanoate, ammonium benzoate, methylammonium formate, methylammonium acetate, methylammonium propanoate, methylammonium butanoate, methylammonium pentanoate, methylammonium hexanoate, methylammonium benzoate, ethylammonium formate, ethylammonium acetate, ethylammonium propanoate, ethylammonium butanoate, ethylammonium pentanoate, ethylammonium hexanoate or ethylammonium benzoate.

Substrate

The substrate may be any suitable substrate. For instance, the substrate may be a substrate suitable for a semiconductor device.

The substrate typically comprises a layer of a first electrode material. Thus the substrate typically comprises one or more first electrodes. The first electrode material may be any suitable electrically conductive material. Suitable conductive materials include metals, transparent conducting oxides, graphite, and conductive polymers. Examples of metals which may form the first electrode material include silver, gold, copper, aluminium, platinum, palladium, or tungsten. The first electrode material typically comprises, or consists essentially of, a transparent conducting oxide. The transparent conducting oxide may be selected from fluorine doped tin oxide (FTO), indium tin oxide (ITO), or aluminium zinc oxide (AZO), and preferably FTO. The first electrode material may form a single layer or may be patterned.

The substrate typically comprises a layer of an n-type semiconductor or a layer of a p-type semiconductor. Preferably, the layer of an n-type semiconductor or the layer of a p-type semiconductor is a compact layer. Compact layers are typically layers without open porosity. The thickness of the layer of an n-type semiconductor or the layer of a p-type semiconductor is typically from 10 nm to 500 nm. For instance, the thickness may be from 50 nm to 200 nm.

The n-type semiconductor may comprise an inorganic or an organic n-type semiconductor. A suitable inorganic n-type semiconductor may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. Typically, the n-type semiconductor is selected from a metal oxide, a metal sulphide, a metal selenide, and a metal telluride. Thus, the n-type semiconductor may be an inorganic material selected from oxide of titanium, tin, zinc, niobium, tantalum, tungsten, indium, gallium, neodymium, palladium, or cadmium, or an oxide of a mixture of two or more of said metals. For instance, the n-type semiconductor may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Preferably, the n-type semiconductor comprises, or consists essentially of, $TiO_2$. The substrate may comprise a compact layer of titanium dioxide.

The p-type semiconductor may comprise an inorganic or an organic p-type semiconductor. Typically, the p-type semiconductor comprises an organic p-type semiconductor. Suitable p-type semiconductors may be selected from polymeric or molecular hole transporters. The p-type semiconductor may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]) or PVK (poly(N-vinylcarbazole)). The p-type semiconductor may comprise carbon nanotubes. Usually, the p-type semiconductor is selected from spiro-OMeTAD, P3HT, PCPDTBT and PVK. Preferably, the p-type semiconductor is spiro-OMeTAD.

The substrate may, for instance, comprise a layer of a first electrode material and a layer of an n-type semiconductor. Often, the substrate comprises a layer of a transparent conducting oxide, for instance FTO, and a compact layer of an n-type semiconductor, for instance $TiO_2$.

In some embodiments, the substrate comprises a layer of a porous scaffold material.

The layer of a porous scaffold is usually in contact with a layer of an n-type or p-type semiconductor material, for instance a compact layer of an n-type semiconductor or a compact layer of a p-type semiconductor. The scaffold material is typically mesoporous or macroporous. The scaffold material may aid charge transport from the crystalline material to an adjacent region. The scaffold material may also aid formation of the layer of the crystalline material during deposition. The porous scaffold material is typically infiltrated by the crystalline material after deposition.

Typically, the porous scaffold material comprises a dielectric material or a charge-transporting material. The scaffold material may be a dielectric scaffold material. The scaffold material may be a charge-transporting scaffold material. The porous scaffold material may be an electron-transporting material or a hole-transporting scaffold material. n-type semiconductors are examples of electron-transporting materials. p-type semiconductors are examples of hole-transporting scaffold materials. Preferably, the porous scaffold material is a dielectric scaffold material or a electron-transporting scaffold material (e.g. an n-type scaffold material).

The porous scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a material by using well-known procedures which do not require undue experimentation. For instance, the band gap of a material can be estimated by constructing a photovoltaic diode or solar cell from the material and determining the photovoltaic action spectrum. The monochromatic photon energy at which the photocurrent starts to be generated by the diode can be taken as the band gap of the material; such a method was used by Barkhouse et al., Prog. Photovolt: Res. Appl. 2012; 20:6-11. References herein to the band gap of a material mean the band gap as measured by this method, i.e. the band gap as determined by recording the photovoltaic action spectrum of a photovoltaic diode or solar cell constructed from the material and observing the monochromatic photon energy at which significant photocurrent starts to be generated.

The thickness of the layer of the porous scaffold is typically from 5 nm to 400 nm. For instance, the thickness of the layer of the porous scaffold may be from 10 nm to 50 nm.

The substrate may, for instance, comprise a layer of a first electrode material, a layer of an n-type semiconductor, and a layer of a dielectric scaffold material. The substrate may therefore comprise a layer of a transparent conducting oxide, a compact layer of $TiO_2$ and a porous layer of $Al_2O_3$.

Process Conditions

The ratio by amount (first precursor compound):(second precursor compound) is typically from 1:0.9 to 1:6. Thus, if 1 mol of the first precursor compound (for instance lead acetate) is disposed on the substrate, from 0.9 mol to 6 mol of the second precursor compound (for instance methyl ammonium iodide) is typically disposed on the substrate. Often, the ratio by amount (first precursor compound):(second precursor compound) is typically from 1:2 to 1:4.

If the crystalline material is a perovskite, the ratio by amount (first precursor compound):(second precursor compound) is typically around 1:3, for instance from 1:2.5 to 1:3.5. For instance, for each equivalent of a first precursor compound $BY_2$ (for instance as defined above) there could be from 2.5 to 3.5 equivalents of a second precursor compound AX (for instance as defined above).

Typically, the first and second precursor compounds are disposed by solution processing. Thus, typically, disposing the first and second precursor compounds on the substrate comprises disposing a composition on the substrate, which composition comprises the first and second precursor compounds and a solvent.

The solvent may be any suitable solvent. The solvent may be a polar solvent or a non-polar solvent. Typically the solvent is a polar solvent. Examples of polar solvents include water, alcohol solvents (such as methanol, ethanol, n-propanol, isopropanol and n-butanol), ether solvents (such as dimethylether, diethylether and tetrahydrofuran), ester solvents (such as ethyl acetate), carboxylic acid solvents (such as formic acid and ethanoic acid), ketone solvents (such as acetone), amide solvents (such as dimethylformamide and diethylformamide), amine solvents (such as triethylamine), nitrile solvents (such as acetonitrile), sulfoxide solvents (dimethylsulfoxide) and halogenated solvents (such as dichloromethane, chloroform, and chlorobenzene). The solvent may be selected from polar protic solvents. Examples of protic polar solvents include water, methanol, ethanol, n-propanol, isopropanol, n-butanol, formic acid, ethanoic acid. Examples of non-polar solvents include alkanes (such as pentane and hexane), cycloalkanes (such as cyclopentane and cyclohexane), and arenes (such as benzene, toluene and xylene). Preferably the solvent is a polar solvent. More preferably, the solvent is a polar aprotic solvent. Examples of polar aprotic solvents include ketone solvents (such as acetone), amide solvents (such as dimethylformamide and diethylformamide), nitrile solvents (such as acetonitrile), sulfoxide solvents (dimethylsulfoxide) and halogenated solvents (such as dichloromethane, chloroform, and chlorobenzene). For example, the solvent may be one or more of dimethyl formamide (DMF), dimethyl sulfoxide (DMSO) and gamma-butyrolactone (GBL). Preferably, the solvent is an amide solvent, for instance dimethylformamide (DMF).

The ratio of the concentration of the first and second precursor compounds is typically as for the amount ratio described above. For instance, the ratio by concentration in the composition comprising the first precursor compound (e.g. $BY_2$), second precursor compound (e.g. AX) and solvent is, for (first precursor compound):(second precursor compound), typically from 1:0.9 to 1:6. Often, the ratio by concentration (first precursor compound):(second precursor compound) is from 1:2 to 1:4, for instance from 1:2.5 to 1:3.5.

The final concentration of the precursor compounds in the composition comprising the precursor compounds and solvent is typically from 10 to 60 wt %. The concentration may be from 30 to 50 wt %, for instance about 40 wt %.

The composition comprising the first and second precursor compounds and a solvent may be disposed on the substrate by any suitable method, for instance solution phase deposition. The composition may be disposed on the substrate by graveur coating, slot dye coating, screen printing, ink jet printing, doctor blade coating, spray coating or spin-coating. Often the composition is disposed by spin-coating.

Alternatively, the deposition of the first and second precursor compounds could be by vapour deposition, for instance vacuum deposition. The first and second precursor compounds may be disposed on the substrate by evaporation from a single source or from two separate sources (simultaneously or sequentially).

In some embodiments, the compounds employed in the process of the invention (i.e. the first precursor compound, the second precursor compound, optionally, a third precursor compound as defined herein, and optionally, an auxiliary metal compound as defined herein), are disposed on the substrate separately or sequentially. Any order of separate or sequential disposition may be employed. Also, each particular compound (of the first precursor compound, the second precursor compound, optionally, the third precursor compound, and optionally, the auxiliary metal compound) may be disposed on the substrate by the same method or by different methods. The methods may be selected, independently for the disposition of each compound, from solution phase deposition, for instance graveur coating, slot dye coating, screen printing, ink jet printing, doctor blade coating, spray coating or spin-coating; and vapour phase deposition, for instance vacuum deposition. Accordingly, in one embodiment of the process of the invention, said disposing comprises disposing on the substrate: the first precursor compound; the second precursor compound; optionally, a third precursor compound as defined herein; and optionally, an auxiliary metal compound as defined herein, simultaneously, separately, or sequentially in any order. Each of said compounds may be disposed on the substrate by a deposition method which is the same or different for each compound, and which may be independently selected from: solution phase deposition, for instance graveur coating, slot dye coating, screen printing, ink jet printing, doctor blade coating, spray coating or spin-coating; and vapour phase deposition, for instance vacuum deposition. In one embodiment, one of the first and second precursor compounds is disposed on the substrate by solution phase deposition, for instance by graveur coating, slot dye coating, screen printing, ink jet printing, doctor blade coating, spray coating or spin-coating; and the other of the first and second precursor compounds is disposed on the substrate by vapour phase deposition, for instance by vacuum deposition. In another embodiment, both of the first and second precursor compounds are disposed on the substrate by solution phase deposition, for instance by graveur coating, slot dye coating, screen printing, ink jet printing, doctor blade coating, spray coating or spin-coating. In another embodiment, both of the first and second precursor compounds are disposed on the substrate by vapour phase deposition, for instance vacuum deposition.

The process of the invention typically further comprises heating the disposed first and second precursor compounds to, or at, a temperature of from 50° C. to 200° C. For instance, the disposed first and second precursor compounds maybe heated to a temperature of from 60° C. to 150° C., or from 90° C. to 110° C. The precursor compounds are typically heated for from 45 seconds to 2 hours. Often, the disposed precursor compounds are heated for from 2 minutes to 20 minutes.

The layer of the crystalline material produced by the process of the invention may be extremely smooth. For instance, the layer of the crystalline material may have a root mean square surface roughness of less than or equal to 50 nm in the range 15 μm×15 μm. Often, the root mean square surface roughness may be less than or equal to 25 nm, or less than or equal to 15 nm, in the range 15 μm×15 μm. The surface roughness may be measured by atomic force microscopy.

The thickness of the layer of crystalline material produced by the method may be any suitable value, which may typically be in the range 1 nm to 1 mm. For instance, the layer of the crystalline material may have a thickness of greater than or equal to 50 nm. Preferably, the layer of the crystalline material has a thickness of greater than or equal to 100 nm, for instance from 100 nm to 700 nm.

In one preferred embodiment, the process comprises:
(a) disposing on a substrate a composition comprising a solvent, said first precursor compound and said second precursor compound; and
(b) removing the solvent;
wherein
the solvent is a polar aprotic solvent,
the first precursor compound is lead (II) acetate, lead (II) formate, lead (II) propanoate, tin (II) formate, tin (II) acetate or tin (II) propanoate, preferably lead (II) acetate and
the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ or $(H_2N-C(H)=NH_2)I$, preferably $(CH_3NH_3)I$.

Removing the solvent is typically performed by heating the disposed composition, for instance at a temperature of from 50° C. to 150° C.

Sacrificial Cation

The inventors have surprisingly found that the process of the invention may be even further improved by the addition of a sacrificial cation (in addition to the sacrificial anion).

Thus, in one embodiment, the process comprises disposing on the substrate:

said first precursor compound;
said second precursor compound; and
a third precursor compound comprising a sacrificial cation, which sacrificial cation comprises two or more atoms and has a lower molecular weight than the second cation. The sacrificial cation can together with the sacrificial anion form a second volatile compound. The sacrificial cation may be referred to as Z.

The first precursor compound, the second precursor compound, the crystalline material, the substrate and all other features of the process using a third precursor compound may be as defined above for the process using only first and second precursor compounds.

The sacrificial anion and the sacrificial cation can together form a second volatile compound. Thus, the compound $Z_zY_y$, where Z is the sacrificial cation, Y is the sacrificial anion and z and y are integers is a volatile compound. As discussed herein, volatile compounds are those compounds which are removed easily by evaporation, whether by evaporation of the compound itself or by evaporation of decomposition products from the compound, or by decomposition.

Typically, the second cation and sacrificial anion do together form a second volatile compound. Thus, the process may further comprise allowing the sacrificial cation and the sacrificial anion to form a second volatile compound and allowing the second volatile compound to be removed from the composition disposed on the substrate. The second volatile compound may be allowed to be removed from the composition disposed on the substrate by allowing the second volatile compound to evaporate, decompose, or evaporate and decompose. Allowing the second volatile compound to be removed may comprise heating the substrate or exposing the composition disposed on the substrate. Often, the substrate and/or composition is heated to remove the second volatile compound. The second volatile compound may evaporate without requiring heating.

Typically, the second volatile compound is more volatile than a compound which consists of the second cation and the second anion. Furthermore, the second volatile compound is typically more volatile than the first volatile compound (i.e. a compound which typically consists of the second cation and the sacrificial anion). The sacrificial cation is chosen such that the second volatile compound is more volatile than the first volatile compound, for instance due to the sacrificial cation having a lower molecular weight than the second cation.

Whether one compound is more volatile than another is easily measured. For instance, thermogravimetric analysis may be performed and the compound which loses certain mass (for instance 5% mass) at the lower temperature is the more volatile. Often, the temperature at which the second volatile compound has lost 5% mass (following heating from room temperature, e.g. 20° C.) is more than 10° C. less than the temperature at which the first volatile compound has lost 5% mass (following heating from room temperature, e.g. 20° C.). For instance, the temperature at which the second volatile compound has lost 5% mass (following heating from room temperature, e.g. 20° C.) may be more than 35° C. less than the temperature at which the compound which consists of the second cation and the second anion has lost 5% mass (following heating from room temperature, e.g. 20° C.). For instance, if a compound which consists of the second cation and the second anion has lost 5% mass at a temperature of 200° C., the second volatile compound has typically lost 5% mass at a temperature of 165° C. or lower.

An example of a reaction scheme for the process of the invention further using a third precursor compound when applied to perovskite layer production may be as follows.

$$AX + 2ZX + BY_2 \rightarrow ABX_3 + 2ZY$$

Here, A is a monocation (i.e. the second cation), B is a metal cation (i.e. the first cation), X is a halide anion, Y is a sacrificial anion and Z is a sacrificial cation. The second volatile compound (ZY) is more volatile than the first volatile compound (AY) would be and this can drive the reaction faster. A may be an organic cation.

Typically, the second precursor compound comprises said second cation and the second anion which is a halide or chalcogenide anion, and the third precursor compound comprises said sacrificial cation and the same halide or chalcogenide anion as is the second anion in the second precursor compound. The third precursor compound may comprise a different halide or chalcogenide anion to the second anion, and this can lead to the production of mixed halide crystalline materials, for instance mixed halide perovskites.

The sacrificial cation is typically a cation which is as defined herein. For instance, the sacrificial cation may be $(NR^1R^2R^3R^4)^+$, $(R^1R^2N=CR^3R^4)^+$, $(R^1R^2N-C(R^5)=NR^3R^4)^+$ or $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group.

The sacrificial cation preferably has a lower molecular weight than the second cation and accordingly $R^1$, $R^2$, $R^3$, $R^4$, $R^5$ and $R^6$ are preferably independently H, methyl or ethyl. For instance, if the second cation is ethylammonium, the sacrificial cation is preferably methylammonium or ammonium. If the is methylammonium, the sacrificial cation is preferably ammonium. Often, the sacrificial cation is ammonium ($NH_4^+$).

Typically, the third precursor compound is $NH_4F$, $NH_4Cl$, $NH_4Br$ or $NH_4I$. For instance, the third precursor compound may be $NH_4Cl$, $NH_4Br$ or $NH_4I$.

The ratio by amount (first precursor compound):(second precursor compound):(third precursor compound) is typically from 1:0.9:1 to 1:3:4. Thus, for each equivalent of the first precursor compound (e.g. $BY_2$), there may be from 0.9 to 3 equivalents of the second precursor compound (e.g. AX) and from 1 to 4 equivalents of the third precursor compound (e.g. ZX). Often, the ratio is from 1:0.9:1.5 to 1:1.1:2.5.

The first, second and third precursor compounds are typically disposed by solution processing as described above. For instance, a composition comprising first, second and third precursor compounds and a solvent may be disposed on the substrate, for instance by spin-coating, or for instance by graveur coating, slot dye coating, screen printing, ink jet printing, doctor blade coating, or spray coating. The solvent is typically a polar aprotic solvent, such as those described above (e.g. DMF). The concentration of the composition is typically from 10 to 60 wt %, or from 30 to 50 wt %, of the precursor compounds.

A preferred embodiment of the process comprises:
(a) disposing on a substrate a composition comprising a solvent, said first precursor compound, said second precursor compound and said third precursor compound; and
(b) removing the solvent;
wherein
the solvent is a polar aprotic solvent, the first precursor compound is lead (II) acetate, lead (II) formate, lead (II) propanoate, tin (II) formate, tin (II) acetate or tin (II) propanoate, preferably lead (II) acetate, the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ or $(H_2N-C(H)=NH_2)I$, preferably $(CH_3NH_3)I$, and the third precursor compound is $NH_4F$, $NH_4Cl$, $NH_4Br$ or $NH_4I$.

Additional steps of heating the disposed composition may be performed as above.

Auxiliary Metal Compound

In some embodiments, it is preferable to include an additional auxiliary metal compound. The auxiliary metal compound can act to reduce the amount of sacrificial anion required for the process to avoid excess sacrificial anion becoming trapped in the produced layer. The auxiliary metal compound typically comprises the first cation (e.g. a metal dication) and the second anion (e.g. a halide anion).

Thus, the process may further comprise disposing on the substrate an auxiliary metal compound, which auxiliary metal compound comprises:
an auxiliary cation which is the same cation as said first cation; and
an auxiliary anion which is the same anion as said second anion.

The auxiliary cation may be as defined for the first cation above. For instance it may be a metal or metalloid cation. The auxiliary anion may be as defined for the second anion above.

For instance it may be a halide or chalcogenide anion.

Preferably, the auxiliary metal compound is a compound of formula $BX_2$ or $MX_4$, wherein B is said auxiliary cation which is the same as said first cation which is a metal or metalloid dication (for instance as defined herein), M is said auxiliary cation which is the same as said first cation which is a metal or metalloid tetracation (for instance as defined herein), and X is said auxiliary anion which is the same as said second anion which is a halide anion. Often, the auxiliary metal compound is a lead (II) halide or a tin (II) halide.

For instance, the first precursor compound may be lead (II) acetate, lead (II) formate, lead (II) propanoate, tin (II) formate, tin (II) acetate or tin (II) propanoate, preferably lead (II) acetate; the second precursor compound may be $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ or $(H_2N-C(H)=NH_2)I$, preferably $(CH_3NH_3)I$; and the auxiliary metal compound may be lead (II) fluoride, lead (II) chloride, lead (II) bromide, lead (II) iodide, tin (II) fluoride, tin (II) chloride, tin (II) bromide or tin (II) iodide. The compounds may respectively be lead (II) acetate, methylammonium iodide and lead (II) iodide. The ratio by amount (first precursor compound:auxiliary metal compound) may be from 1:99 to 99:1. It is often for instance from 1:50 to 50:1, or for instance from 1:10 to 10:1. Typically, it is from 1:2 to 2:1. The auxiliary metal compound may be present as well as the third precursor compound (as, for example, in the reaction $2MAI + 0.5PbI_2 + 0.5PbAc_2 \rightarrow MAPbI_3 + MAAc$).

Layer

The invention also provides a layer of a crystalline material obtainable by a process according to the invention.

Process for Producing a Semiconductor Device

The invention also provides a process for producing a semiconductor device comprising a layer of a crystalline material, which process comprises producing said layer of a crystalline material by a process according to the invention.

The process typically further comprises disposing on the layer of a crystalline material a layer of a p-type semiconductor or a layer of a n-type semiconductor. Often, the process typically comprises disposing on the layer of a crystalline material a layer of a p-type semiconductor. The n-type or p-type semiconductor may be as defined herein. For instance, the p-type semiconductor may be an organic p-type semiconductor. Suitable p-type semiconductors may be selected from polymeric or molecular hole transporters. Preferably, the p-type semiconductor is spiro-OMeTAD. The layer of a p-type semiconductor or a layer of a n-type semiconductor is typically disposed on the layer of the crystalline material by solution-processing, for instance by disposing a composition comprising a solvent and the n-type or p-type semiconductor. The solvent may be selected from polar solvents, for instance chlorobenzene or acetonitrile. The thickness of the layer of the p-type semiconductor or the layer of the n-type semiconductor is typically from 50 nm to 500 nm.

The process typically further comprises disposing on the layer of the p-type semiconductor or n-type semiconductor a layer of a second electrode material. The second electrode material may be as defined above for the first electrode material. Typically, the second electrode material comprises, or consists essentially of, a metal. Examples of metals which the second electrode material may comprise, or consist essentially of, include silver, gold, copper, aluminium, platinum, palladium, or tungsten. The second electrode may be disposed by vacuum evaporation. The thickness of the layer of a second electrode material is typically from 5 nm to 100 nm.

Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, or a light-emitting diode.

The semiconductor device is typically an optoelectronic device. Examples of optoelectronic devices include photovoltaic devices, photodiodes (including solar cells), phototransistors, photomultipliers, photoresistors, and light emitting devices. Preferably, the semiconductor device is a photovoltaic device.

The invention also provides a semiconductor device obtainable by a process for producing a semiconductor device according to the invention.

A photovoltaic device according to the invention may comprise the following layers in the following order:
I. a layer of a first electrode material as defined herein;
II. a layer of an n-type semiconductor as defined herein
III. optionally a layer of a porous scaffold material as defined herein;
IV. a layer of a crystalline material as defined herein;
V. a layer of an p-type semiconductor as defined herein; and
VI. a layer of a second electrode material as defined herein.

A photovoltaic device according to the invention may comprise the following layers in the following order:

I. a layer of a transparent conducting oxide, preferably FTO;
II. a compact layer of an n-type semiconductor as defined herein, preferably $TiO_2$;
III. optionally a layer of a porous scaffold material as defined herein, preferably $Al_2O_3$ or $TiO_2$;
IV. a layer of a crystalline material as defined herein;
V. a layer of an p-type semiconductor as defined herein, preferably spiro-OMeTAD; and
VI. a layer of a second electrode material comprising gold or silver.

The layer of the first electrode material may have a thickness of from 100 nm to 700 nm, for instance of from 100 nm to 400 nm. The layer of the second electrode material may have a thickness of from 10 nm to 500 nm, for instance from 50 nm to 200 nm or from 10 nm to 50 nm. The layer of an n-type semiconductor may have a thickness of from 50 nm to 500 nm.

The layer of an p-type semiconductor may have a thickness of from 50 nm to 500 nm.

Composition

The invention also provides compositions useful in the formation of layers of a crystalline material. Thus, the invention provides a composition comprising:
(a) a solvent;
(b) $NH_4X$;
(c) AX; and
(d) $BY_2$ or $MY_4$;
wherein
each X is independently $I^-$, $Br^-$, $Cl^-$ or $F^-$;
A is $Li^+$, $Na^+$, $K^+$, $Rb^+$, $Cs^+$, $(NR^1_4)^+$ or $(H_2N-C(R^1)=NH_2)^+$, wherein each $R^1$ is independently selected from H and an unsubstituted $C_{1-6}$ alkyl group;
B is $Cu^{2+}$, $Pb^{2+}$, $Ge^{2+}$, $Sn^{2+}$, $Fe^{2+}$ or $Zn^{2+}$;
M is $Sn^{4+}$, $Pb^{4+}$, $Ge^{4+}$ or $Te^{4+}$; and
Y is an anion of formula $RCOO^-$ or $NO_3^-$ wherein R is H or unsubstituted $C_{1-6}$ alkyl.

The solvent may be as described above. For instance, the solvent may be a polar aprotic solvent such as dimethylformamide.

A is often $(R^1NH_3)^+$, $(NR^2_4)^+$ or $(H_2N-C(R^1)=NH_2)^+$, wherein $R^1$ is an unsubstituted $C_{1-6}$ alkyl group and each $R^2$ is independently an unsubstituted $C_{1-6}$ alkyl group. B may for instance be $Cu^{2+}$, $Pb^{2+}$, $Ge^{2+}$ or $Sn^{2+}$. M is typically $Sn^{4+}$, $Pb^{4+}$, $Ge^{4+}$ or $Te^{4+}$. Y is often an anion of formula $RCOO^-$, wherein R is H or unsubstituted $C_{1-6}$ alkyl.

Often, the composition comprises greater than or equal to 95 wt % of the components (a) to (d). The composition may consist essentially of the components.

Each X may independently $I^-$, $Br^-$ or $Cl^-$. A is typically $(R^1NH_3)^+$, wherein $R^1$ is an unsubstituted $C_{1-6}$ alkyl group. B is typically $Pb^{2+}$ or $Sn^{2+}$. M is typically $Sn^{4+}$ or $Pb^{4+}$. Y is typically formate or acetate.

For instance, the composition may comprise:
(a) a solvent;
(b) $NH_4X$;
(c) $CH_3NH_3X$; and
(d) $PbAc_2$ or $SnAc_2$;
wherein
each X is independently $I^-$, $Br^-$, $Cl^-$ or $F^-$, preferably $I^-$.
Typically, the ratio by amount (d):(c):(b) is from 1:0.9:1 to 1:3:4, preferably from 1:0.9:1.5 to 1:1.1:2.5.

The invention will now be further described by the following Examples.

EXAMPLES

Example 1—Sacrificial Anion

Method

Perovskite Precursor Preparation

Methylammonium iodide (MAI) was prepared by reacting methylamine, 33 wt % in ethanol (Sigma-Aldrich), with hydroiodic acid (HI) 57 wt % in water (Sigma-Aldrich), at room temperature. HI was added dropwise while stirring. Upon drying at 100° C., a white powder was formed, which was dried overnight in a vacuum oven and purified with ethanol before use. To form the perovskite precursor solution, MAI and $PbX_2$ (X=Ac, Cl, I, where Ac is acetate: $H_3CCOO^-$) were dissolved in anhydrous N,N-dimethylformamide (DMF) at a 3:1 molar ratio with final perovskite precursor concentrations of ~40 wt %.

Substrate Preparation

Glass substrates for photoluminescence (PL) measurements were cleaned sequentially in 2% hallmanex detergent, acetone, propan-2-ol and oxygen plasma. Devices were fabricated on fluorine-doped tin oxide (FTO) coated glass (Pilkington, $7\Omega\square^{-1}$). Initially FTO was removed from regions under the anode contact, to prevent shunting upon contact with measurement pins, by etching the FTO with 2M HCl and zinc powder. Substrates were then cleaned and plasma-etched as above. A hole-blocking layer of compact $TiO_2$ was deposited by spin-coating a mildly acidic solution of titanium isopropoxide in ethanol, and annealed at 500° C. for 30 minutes. Spin-coating was carried out at 2000 rpm for 60 seconds.

Perovskite Deposition

To form the perovskite layer for spectroscopy measurements, the non-stoichiometric precursor was spin-coated on the substrate at 1500 rpm in glovebox. The concentration of perovskite solution was 20 wt %. After spin-coating, the films were annealed in air at 100° C. for 5 minutes, 100° C. for 45 minutes and 150° C. for 40 minutes for perovskite made from $PbAc_2$, $PbCl_2$ and $PbI_2$, respectively. The top quenchers were then deposited in air via spin-coating chlorobenzene solutions with the following conditions: poly(methylmethacrylate) (PMMA; Sigma-Aldrich) at 10 mg/ml and phenyl-C61-butyric acid methyl ester (PCBM; Solenne BV) at 30 mg/ml, both spin-coated at 1000 rpm, and 2,2',7,7'-tetrakis-(N,N-di-p-methoxyphenylamine)9,9'-spirobifluorene (spiro-OMeTAD; Borun Chemicals) at 48 mM spin-coated at 2000 rpm.

Device Construction

For devices, the perovskite layers were prepared by spin-coating a 40 wt % precursor solution at 2000 rpm in a nitrogen-filled glovebox. After spin-coating, the films were left to dry at room temperature in the glovebox for 30 minutes. After this, the films were annealed at 100° C. for 5 minutes, 100° C. for 2 hours and 150° C. for 40 minutes for perovskite made from $PbAc_2$, $PbCl_2$ and $PbI_2$, respectively. The spiro-OMeTAD hole-transporting layer was then deposited from a 66 mM chlorobenzene solution containing additives of lithium bis(trifluoromethanesulfonyl)imide and 4-tert-butylpyridine. Devices were then left overnight in air. Finally, 120 nm silver electrodes were thermally evaporated under vacuum of ~$10^{-6}$ Torr, at a rate of ~0.1 nm/s, to complete the devices.

Characterization

SEM:

A field emission scanning electron microscope (Hitachi S-4300) was used to acquire SEM images. Sample thicknesses were measured using a Veeco Dektak 150 surface profilometer.

XRD:

$2\theta$ scans were obtained from samples of perovskite deposited on the compact-$TiO_2$-coated FTO glass using an X-ray diffractometer (Panalytical X' Pert Pro)

AFM:

The AFM images were obtained using a ThermoMicroscope M5 in non-contact mode and scanning over a range of 15 μm by 15 Ξm at a resolution of 256×256 data points. The surface roughness was measured as the root mean squared roughness over the scanning area.

UV-Vis:

The absorbance of the perovskite films on compact-TiO2 coated FTO glass were measured on a Carry 300 Bio (Agilent Technologies) with an integrating sphere accessory. To reduce the sample variance, at least 3 samples were determined for each group and the average of all spectra presented.

Elemental Analysis:

The samples were made on normal glass using the same spin-coating and anneal conditions for device fabrication. The pervoskite films were then carefully scratched off from the substrate in the glovebox. For each lead precursor, 30 mg perovskite powder was collected. To determine the concentration of chlorine ion, 15 mg of sample was accurately weighted and bed filled into the flask with oxygen. The sample was then ignited and the combustion products were directly titrated in the combustion flask using $AgNO_3$ (0.1 umol/uL, inject 1 uL each time, or corresponding to 30 ppm resolution).

Thermal Gravimetric Analysis (TGA):

Thermal decomposition profiles of MAX (X=Cl, I, Ac) were recorded by a thermogravimetric analyzer TA Q500 in nitrogen atmosphere with a flow rate of 20 cc/min. The temperature varied from 25° C. to 600° C. at a heating rate of 10° C./min.

PDS Measurement:

Photothermal deflection spectroscopy (PDS) measurements were carried out for perovskite films growth on a compact $TiO_2$ layer, following the same procedure we used to prepare the solar cells. For this particular measurement, quartz was made use of rather than the FTO coated glass to minimize the light absorption due to the substrate. During the measurement the samples were kept in a hermetically sealed quartz cuvette filled with an inert liquid such as Fluorinert FC-72 from 3M Corporation, which acts as deflection medium with high temperature dependent refractive index. The perovskite films were excited from the quartz side with a modulated monochromated light beam perpendicular to the plane of the sample. Modulated monochromated light beam was produced by a combination of a Light Support MKII 100 W Xenon arc source and a CVI DK240 monochromator. The transverse probe beam was produced with Qioptiq 670 nm fiber-coupled diode laser and passed as close as possible to the perovskite film surface. Beam deflection was measured using a differentially amplified quadrant photodiode and a Stanford Research SR830 lock-in amplifier.

Photoluminescence:

PL samples consisted of perovskites prepared on glass and sealed with the inert polymer poly(methyl methacrylate) (PMMA). PL spectra were acquired using a time-resolved single photon counting setup (FluoTime 300, PicoQuant GmbH). Samples were photoexcited using a 507 nm laser head (LDH-P-C-510, PicoQuant GmbH) with pulse duration of 117 ps, fluences of ~0.03 µJ/cm$^2$/pulse, and a repetition rate of 10 MHz.

Wide Angle X-Ray Scattering (WAXS):

Samples were spin-coated at the Cornell High Energy Synchrotron Source (CHESS) and loaded on a custom-built temperature-controlled grazing incidence stage at the D1 beamline, with a typical transfer period of 2-5 minutes. Images were collected using a Pilatus 300 K high speed pixel array detector, 487×619 pixels with 172 µm/pixel resolution, at a distance of 93 mm from the sample. The x-ray wavelength was 0.1155 nm and the incident beam angle was approximately 0.5°, well above the substrate critical angle. Typical exposure times were less than 1 second. Samples were moved after each exposure to avoid beam damage and the total spectra for a given sample collected at 12-16 different locations. The extraction of the transformed fraction of the film (x) from the WAXS data is described fully elsewhere. Briefly, the point of complete perovskite formation is taken as the point in time when the peaks due to the precursor structure disappear; this time is designated as t1; x is then taken as the ratio of the (110) peak intensity relative to the (110) peak intensity at t1.

Impedance.

Electrochemical impedance (EIS) measurements were performed under open-circuit conditions by illuminating the solar cells using a powerful LED array (maximum output power of 306 lumen at 700 mA driving current), emitting light at 627 nm. Light intensities were adjusted by controlling the diode's current by a LED driver; the LED was previously calibrated employing a Si reference photodiode. The illuminated area of the solar cells was set at 0.0625 cm$^2$, using a mask. The spectra were recorded by varying the frequency range from 100 KHz to 10 mHz (amplitude of voltage perturbation: 15 mV RMS) using an electrochemical working station (Autolab PGSTAT302N, Ecochemie) and its built-in frequency response analyzer (FRA2). The recorded spectra were fitted using the NOVA software.

Solar Cell Characterization:

Current density-voltage (J-V) curves were measured (2400 Series SourceMeter, Keithley Instruments) for devices under simulated AM 1.5 sunlight at 100 mWcm$^{-2}$ irradiance generated by an Abet Class AAB sun 2000 simulator, with the intensity calibrated with an NREL calibrated KG5 filtered Si reference cell. The mismatch factor was calculated to be less than 1%. The solar cells were masked with a metal aperture to define the active area, typically 0.0625 cm$^2$ (measured individually for each mask) and measured in a light-tight sample holder to minimize any edge effects and ensure that the reference cell and test cell are located in the same spot under the solar simulator during measurement.

Results

Different perovskite precursor solutions were prepared by mixing 3:1 (by amount) of MAI: PbX$_2$ in N,N-Dimethylformamide (DMF), where X is I, Cl or Ac (see method). Films were fabricated on FTO/c-TiO$_2$ substrates by one-step spin coating of different perovskite precursors in the glovebox. The perovskite film made from PbCl$_2$ or PbAc$_2$ precursor solution was annealed at 100° C. in the glovebox after spin coating. However, it was noted that no perovskite forms at 100° C. from the PbI$_2$ precursor solution even after 12 hours annealing, and thus the annealing temperature was increased to 150° C. to speed up the perovskite film formation to feasible lab time scales. The annealing times are optimized separately for each precursor to achieve best device performance (see Method).

Layer Characteristics

The X-ray diffraction spectra for perovskite films deposited on a FTO/c-TiO$_2$ substrate from the three different lead precursors as described are shown in FIG. 1. Peaks labelled with a * are assigned to the fluorine-doped tin oxide (FTO) substrate, those with a # to PbI$_2$ impurities, and the other peaks are assigned to the labeled reflections from a tetragonal perovskite lattice with unit cell parameters a=b=8.85 Å, c=12.64 Å, in good agreement with previous reports on MAPbI$_3$. From the XRD spectra shown in FIG. 1, It is evident that the materials fabricated with the different precursors show the same crystal structure of MAPbI$_3$ after annealing, indicating that the final perovskite is the same.

From Scherrer equation, the crystal sizes of perovkite made from PbI$_2$, PbCl$_2$ and PbAc$_2$ are estimated to be 305±65 nm, >500 nm (larger than machine resolution) and 135±45 nm, respectively. These values are based on assumption that perovskite are spherical crystals. In the samples, due to the film thickness limitation, we expect that the crystal directions parallel to the substrate are much larger than the vertical direction, meaning that the crystal size is underestimated by the Scherrer equation. However, considering that all the samples have similar film thickness (shown in FIG. 6), the reported trend can still be assumed to be valid.

Figure 2:
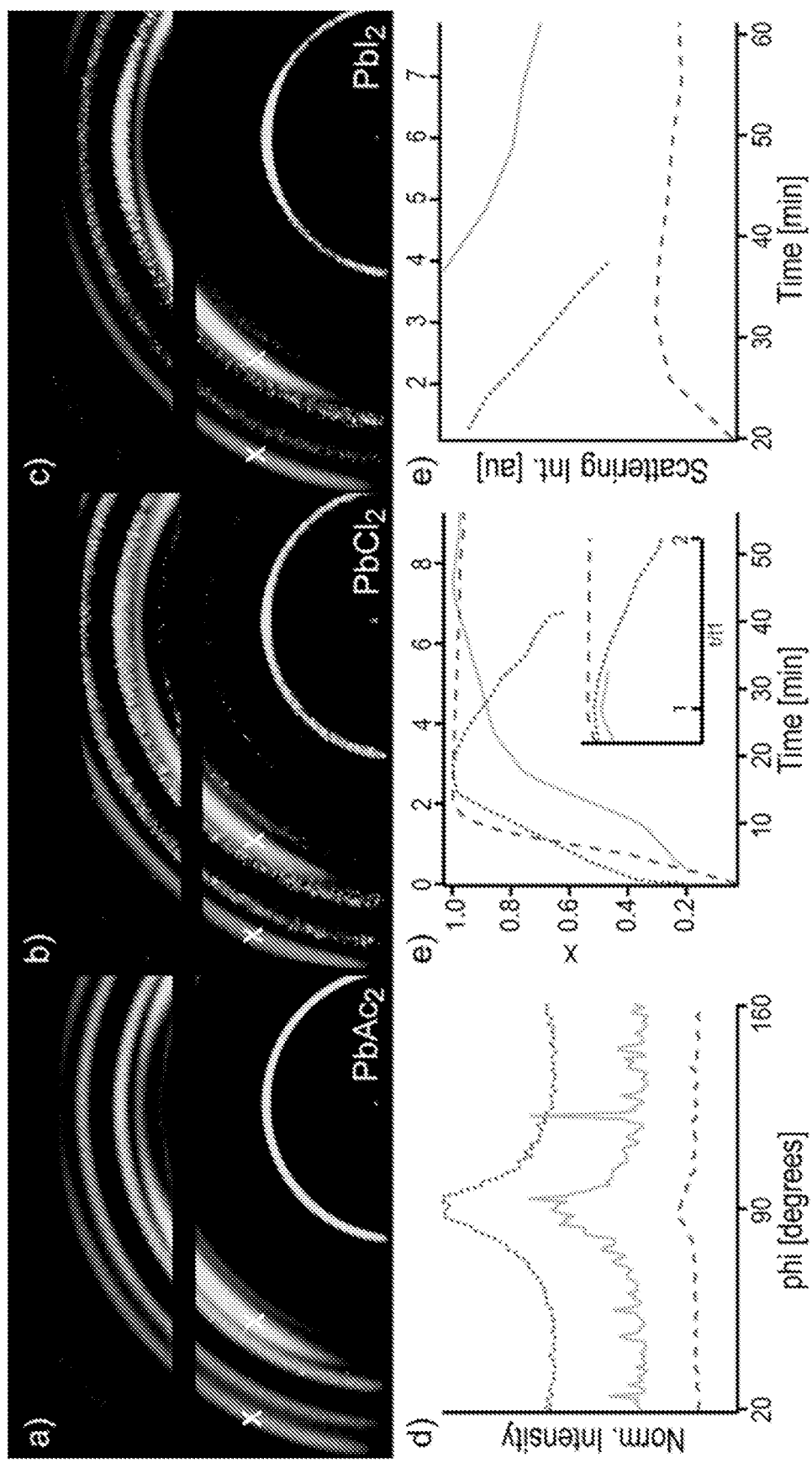
FIG. 2 shows in-situ WAXS data for all three systems. 2D scattering images for films made from (a) $PbAc_2$, (b) $PbCl_2$, and (c) $PbI_2$. The 2 rings marked with a "x" are from the $TiO_2$ substrate, horizontal line is the detector seam. (d) Azimuthal line scans for (110) peak at 10 $nm^{-1}$ (q vector) for the $PbAc_2$ (dash), $PbCl_2$ (solid) and $PbI_2$ (dot). (e) x(t) plots for all three samples with the $PbAc_2$ plotted against the top abscissa and $PbCl_2/PbI_2$ against the bottom abscissa, inset shows the time normalized x(t) after t1. (x(t) and t1 are defined in the text.) (f) Absolute peak intensity for the (110) reflection, same line type and axis as (e).

To understand the evolution of the perovskite crystal formation using different lead precursors, in-situ wide-angle X-ray scattering (WAXS) was performed. FIG. 2 shows in-situ WAXS data for all three systems. 2D scattering images for films made from (a) PbAc$_2$, (b) PbCl$_2$, and (c) PbI$_2$. The 2 rings marked with a "X" are from the TiO$_2$ substrate, horizontal line is the detector beam. (d) Azimuthal line scans for (110) peak at 10 nm$^{-1}$ (q vector) for the PbAc$_2$ (dash), PbCl$_2$ (solid) and PbI$_2$ (dot). (e) x(t) plots for all three samples with the PbAc$_2$ plotted against the top abscissa and PbCl$_2$/PbI$_2$ against the bottom abscissa, inset shows the time normalized x(t) after t1. (x(t) and t1 are defined in the text.) (f) Absolute peak intensity for the (110) reflection, same linetype and axis as (e).

The average transformed fraction, x, was derived from the raw data and is plotted as a function of time in FIG. 2e. From this data it is clear that the rate of perovskite formation is faster for the precursor with PbAc$_2$ than those made from PbCl$_2$ at the same temperature (100° C.). In previous studies it has been demonstrated that the perovskite formation is a thermally activated phenomenon as the PbCl$_2$ based films annealed at 130° C. with the evolution time of ~8-10 minutes and it can be extrapolated that, at 150° C., the PbCl$_2$ would be faster than PbI$_2$. On the basis of the above observation the relative rate of the evolution to the completely formed perovskite: PbAc$_2$>>PbCl$_2$>PbI$_2$. The 2D WAXS images (FIG. 2a-c) and radial 1D line scans taken at the (110) peak location (FIG. 2d), show that the faster process for PbAc$_2$ results in a material with smaller grains with weaker crystallographic orientation, as expected due to the faster rate of crystallization.

The in-situ WAX measurements were continued even after the perovskite crystal was formed to investigate the affect of annealing on the crystal coarsening and structural stability. After the point in time ti when x(t) first equals 1, the changes in x(t) are due to the appearance of the PbI$_2$ peak at 9 nm$^{-1}$, the reported decomposition product. The inset in FIG. 2e shows an expanded plot of this timeframe with the time axis normalized to the crystallization time such that t=1 at the first point in time when x(t)=1; from this data it is clear that the PbAc$_2$ films are more stable against decomposition relative to their crystallization time.

In the experimental setup used, it is reasonable to assume that the sample volume is both unchanging and an appropriate ensemble, i.e. changes in the scattering intensity over time are not due to local variations in film volume or morphology. With this assumption, the absolute scattering intensity (normalized only for incident beam flux) can be taken as an indicator of changes to the crystal morphology that is not accompanied by a material change. FIG. 2 shows the plot of the absolute intensity of the (110) peak for all three systems from the point in time when x(t)=1 onward. The PbI$_2$ and PbCl$_2$ films show that the complete transformation to the perovskite is immediately followed by the onset of decomposition, i.e. there is no coarsening once the perovskite forms. The time evolution of the scattering intensity for the PbAc$_2$ film has two distinct differences; first, the absolute intensity continues to increase after the perovskite is fully formed, indicating some coarsening does take place and, second, the intensity stays much closer to its maximum value providing additional evidence of a slower decomposition.

The transition process of precursor mixture into perovskite is typically described by the following equation:

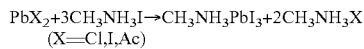

PbX$_2$+3CH$_3$NH$_3$I→CH$_3$NH$_3$PbI$_3$+2CH$_3$NH$_3$X (X=Cl,I,Ac)

Figure 16:
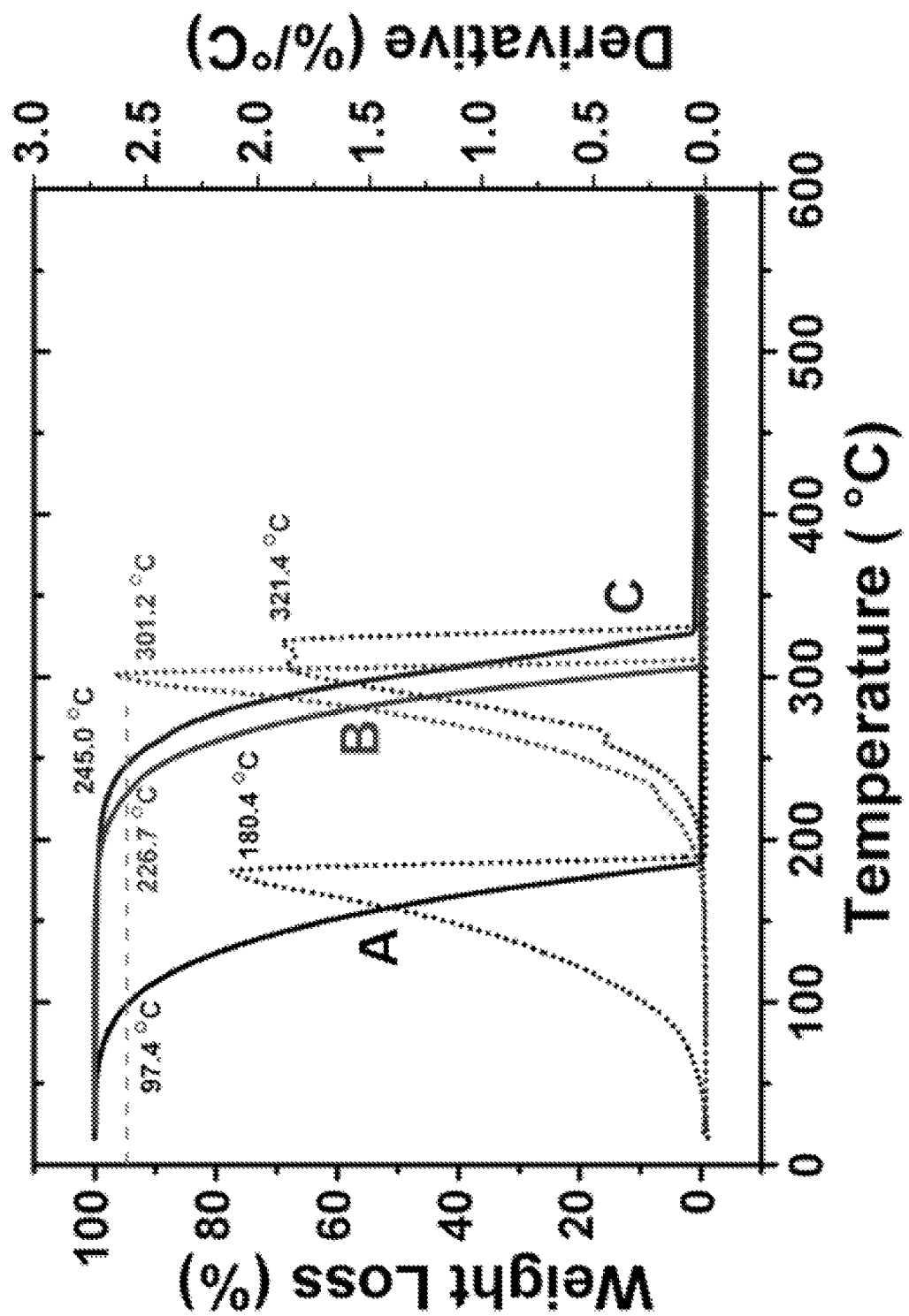
FIG. 16 shows thermogravimetric analysis curves for $CH_3NH_3Ac$ (A, left curve, methylammonium acetate), $CH_3NH_3I$ (B, middle curve, methylammonium iodide) and $CH_3NH_3Cl$ (C, right curve, methylammonium chloride) in a nitrogen atmosphere.

The above reaction typically involves the evaporation of solvent, sublimation/evaporation of by-product (CH$_3$NH$_3$X), crystal nucleation and growth, etc. As shown in the WAXS study, the anneal time is much shorter for perovskite made from PbAc$_2$ precursor than PbCl$_2$ and PbI$_2$, which could be correlated to the ease at which the by-product can be removed during perovskite film formation. To confirm this hypothesis, the thermal gravimetric analysis (TGA) curves for the by-product CH$_3$NH$_3$X (X=Cl, I, Ac) were recorded. As shown in FIG. 16, the initial decomposition temperature (T at 95% weight) is 97.4, 226.7 and 245.0° C. for CH$_3$NH$_3$Ac, CH$_3$NH$_3$Cl and CH$_3$NH$_3$I, respectively, which is consistent with the trend of derivative weight loss/temperature where T$_d$ (CH$_3$NH$_3$Ac)<T$_d$ (CH$_3$NH$_3$Cl)<T$_d$ (CH$_3$NH$_3$I). This indicates that the CH$_3$NH$_3$Ac is thermally unstable and much easier to be removed than CH$_3$NH$_3$Cl and CH$_3$NH$_3$I at the adopted processing temperature range. Thus, at the same anneal temperature, the nucleation density is much higher for PbAc$_2$ than the other two, which tends to form a large amount of relatively smaller crystals in a short time scale (1-2 min) and fully covers the substrate. While for the PbCl$_2$ and PbI$_2$ routes the MACl and MAI is thermally more stable and needs long annealing times to be removed. In this context, the nucleation density is lower and intends to form large crystals. As such, porous films are frequently observed.

Optical Properties

Figure 3:
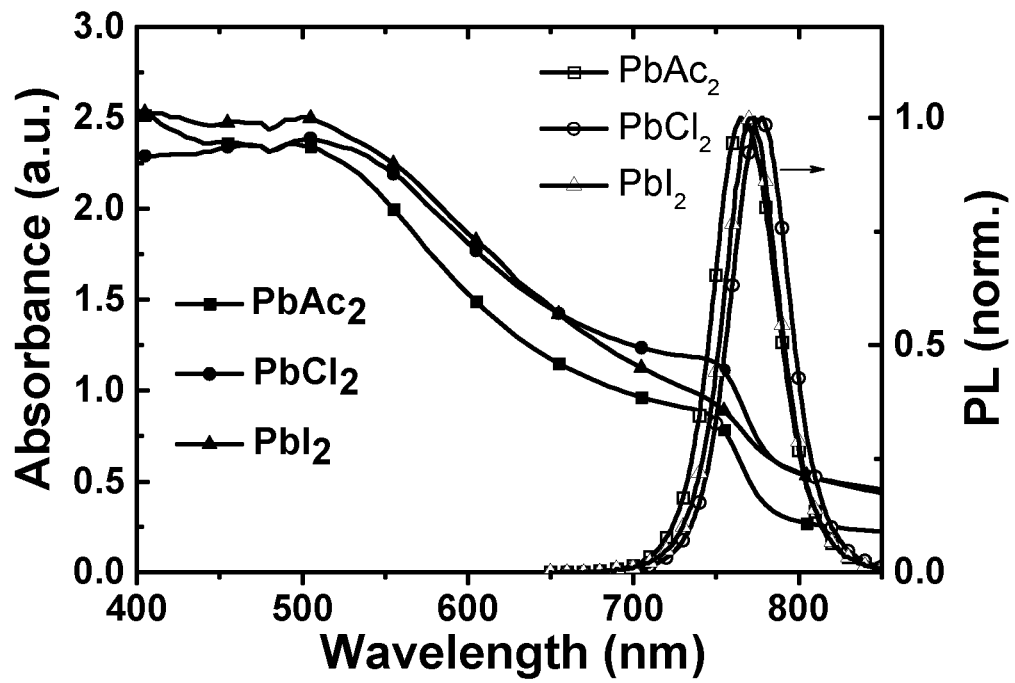
FIG. 3 shows absorption spectra (left axis) and photoluminescence spectra (PL, right axis) for perovskite films deposited on a FTO/c-$TiO_2$ substrate made from the three different lead precursors ($PbI_2$, $PbCl_2$ and $PbAc_2$).

The absorption and photoluminescence (PL) spectra of perovskites synthesized with different lead sources are shown in FIG. 3. The reasonably similar absorption edge and sharp PL spectra at about 775 nm is observed for all samples, corroborating as reported optical bandgap (Eg) of ~1.60 eV for MAPbI$_3$ perovskites. The PL spectra for PbI$_2$ and PbAc$_2$ are slightly blue-shifted with respect to the PbCl$_2$-prepared perovskite, where the magnitude of the shift correlates inversely with the observed crystal size.

Figure 4:
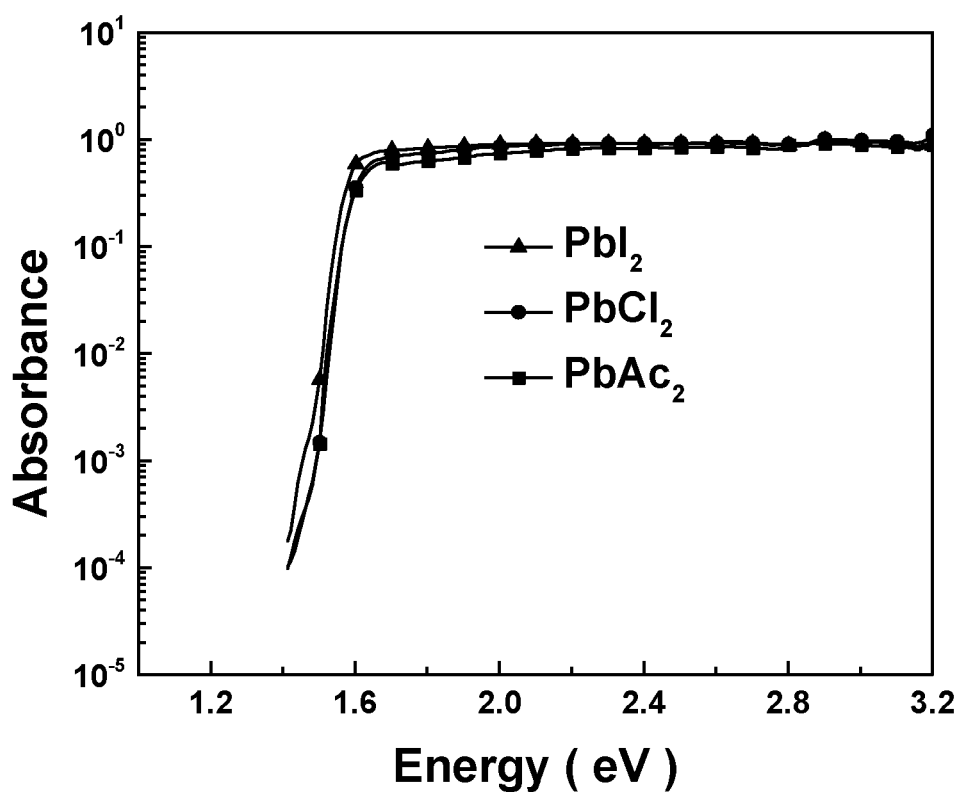
FIG. 4 shows the absorption spectra of $CH_3NH_3PbI_3$ perovskite films made from the different lead precursors measured using photothermal deflection spectroscopy (PDS) technique.

Photothermal deflection spectroscopy (PDS) was used to measure the optical absorption of the perovskite films near the band edge with high sensitivity. The absorption profiles of CH$_3$NH$_3$PbI$_3$ made from different lead precursors as determined through PDS are shown in FIG. 4. The extent of the absorption tail below the band gap is correlated with the degree of disorder within the material, which could originate from thermal fluctuation of the ions composing the material but also from defects of the crystalline structure. Indeed, several recent modelling works reported that defects within CH$_3$NH$_3$PbI$_3$ perovskite crystal would result in localized states in the range of a few hundred meV from the extended states of the bands, which will be detected as a broadening of the Urbach tail. Assuming the same level of thermal disorder, the slope of the exponential part of the Urbach tail gives an estimation about the concentration of these defects, in terms of Urbach energy 'E$_u$'. The estimated Urbach energies for samples made from PbCl$_2$, PbAc$_2$ and PbI$_2$ precursors are 14, 14.4 and 16 meV respectively. These values suggest that within the measurement error, PbI$_2$ has a higher level of disorder compared to both PbCl$_2$ and PbAc$_2$.

Morphology

Figure 5:
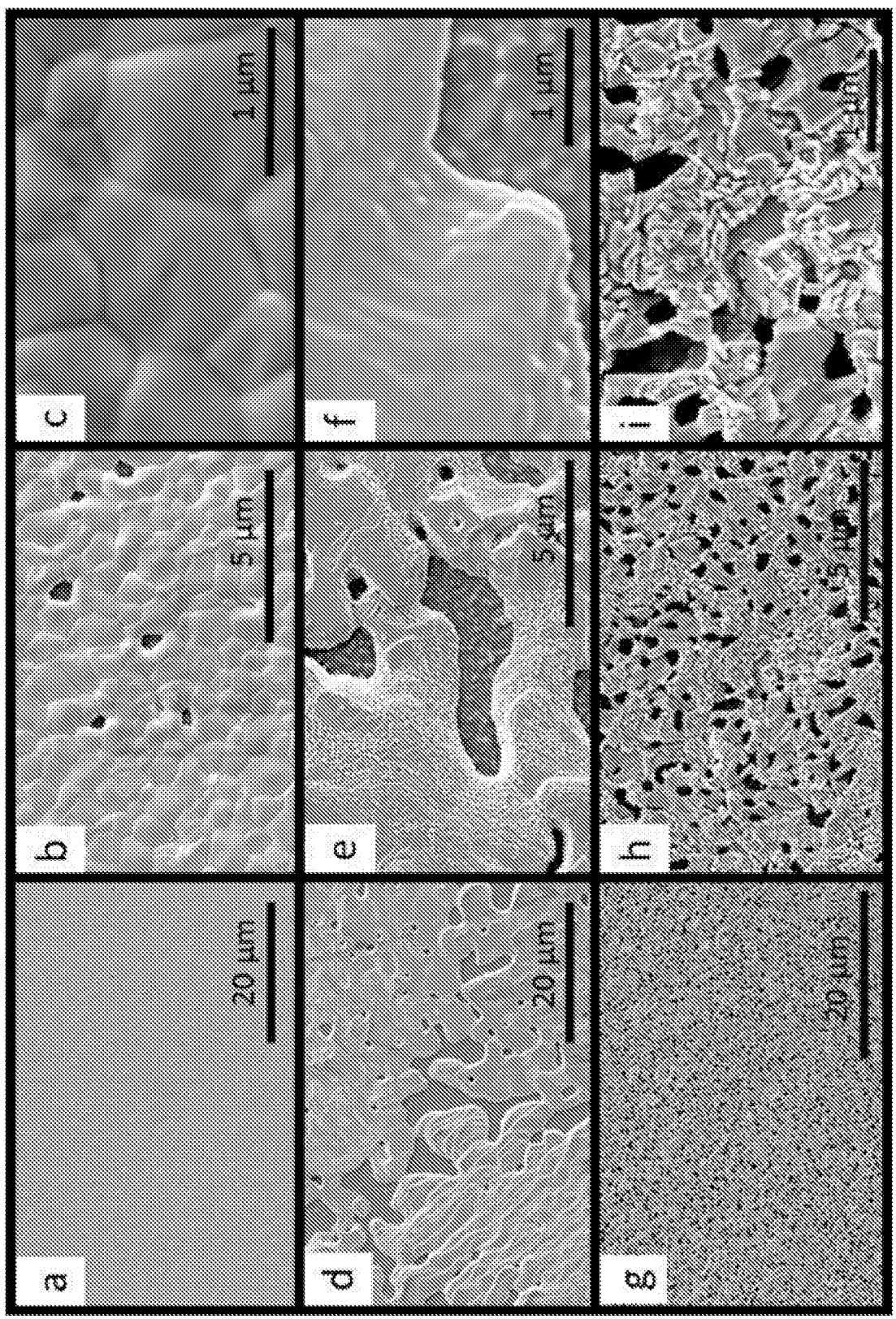
FIG. 5 shows SEM images of perovskite films deposited on a FTO/c-$TiO_2$ substrate from the three different lead precursors $PbAc_2$ (a, b, c), $PbCl_2$ (d, e, f) and $PbI_2$ (g, h, i), with the scale bar as: 20 μm for a, d, g; 5 μm for b, e, h; and 1 μm for c, f, i.

As shown in FIG. 5, the perovskite film made from PbAc$_2$ precursor has the characteristics of almost full surface coverage on the substrates (a, b), with remarkable grain size up to microscale (c). However, the perovskite films made from PbCl$_2$ (d, e) and PbI$_2$ (g, h) are highly porous and the grain boundary is indistinguishable (f, i).

Figure 6:
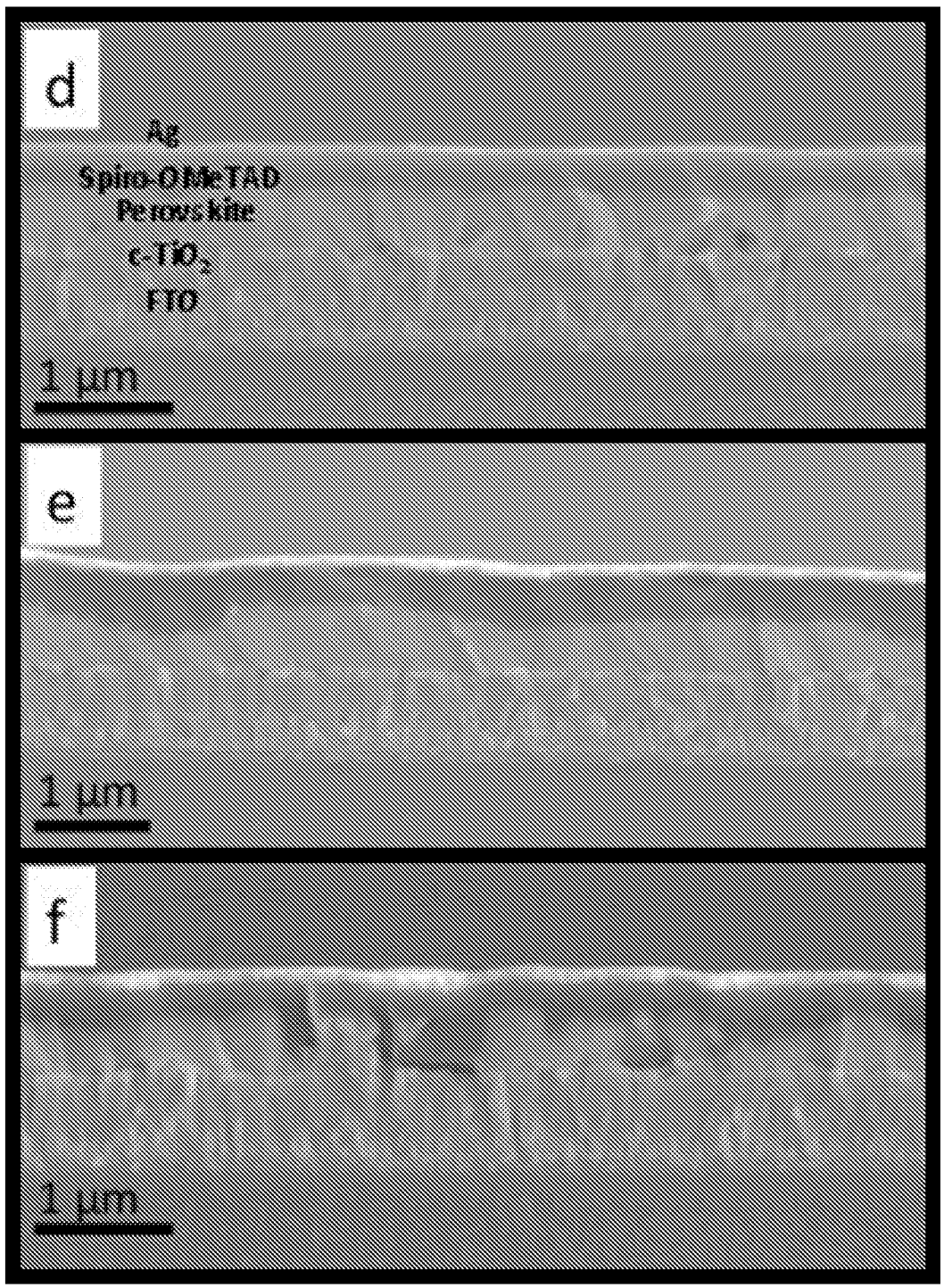
FIG. 6 shows cross-section SEM images of full devices made from lead precursors $PbAc_2$ (d), $PbCl_2$ (e) and $PbI_2$ (f).

Cross sectional SEM images of full devices made from lead precursors PbAc$_2$ (d), PbCl$_2$ (e) and PbI$_2$ (f) are shown in FIG. 6. From the cross-section SEM images, the perovskite film made from PbAc$_2$ precursor is flat (d) as compared to that made from PbCl$_2$ (e) and PbI$_2$ (f), which show an undulating nature.

Figure 7:
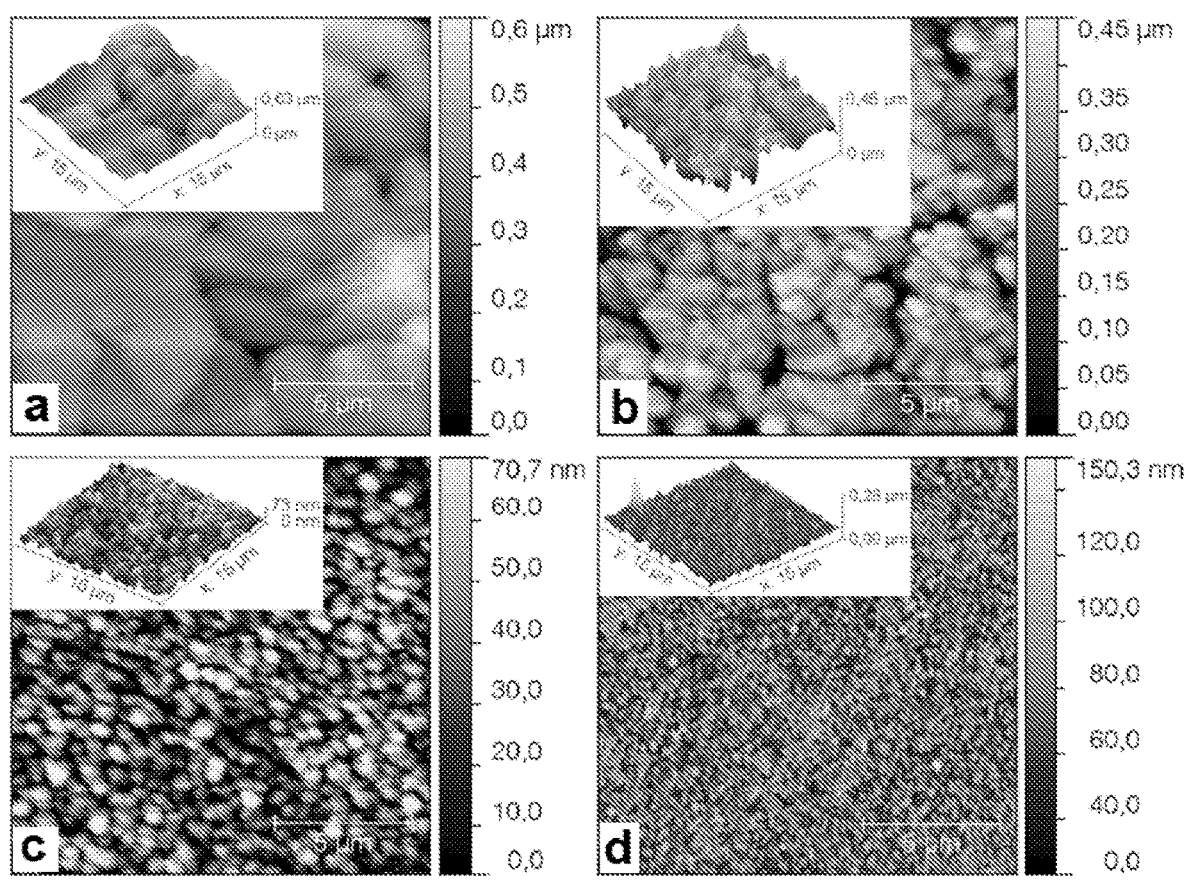
FIG. 7 shows AFM images of perovskite films deposited on a FTO/c-$TiO_2$ substrate by spin-coating from the three different perovskite precursor solutions, $PbCl_2$ (a), $PbI_2$ (b), $PbAc_2$ (c), and vapour-deposited film based on $PbCl_2$ with $CH_3NH_3I$ (d).

Atomic force microscopy (AFM) images of perovskite films deposited on a FTO/c-TiO$_2$ substrate by spin-coating from the three different lead precursors, PbCl$_2$ (a), PbI$_2$ (b), PbAc$_2$ (c), and vapor-deposited film based on PbCl$_2$ (d), are shown in FIG. 7. The surface roughness of the perovskite films made from PbCl$_2$ (FIG. 7a), PbI$_2$ (FIG. 7b) and PbAc$_2$ (FIG. 7c) were measured by AFM and calculated to be 62.4, 52.2 and 12.3 nm, respectively, in the range of 15 µm×15 µm.

Figure 8:
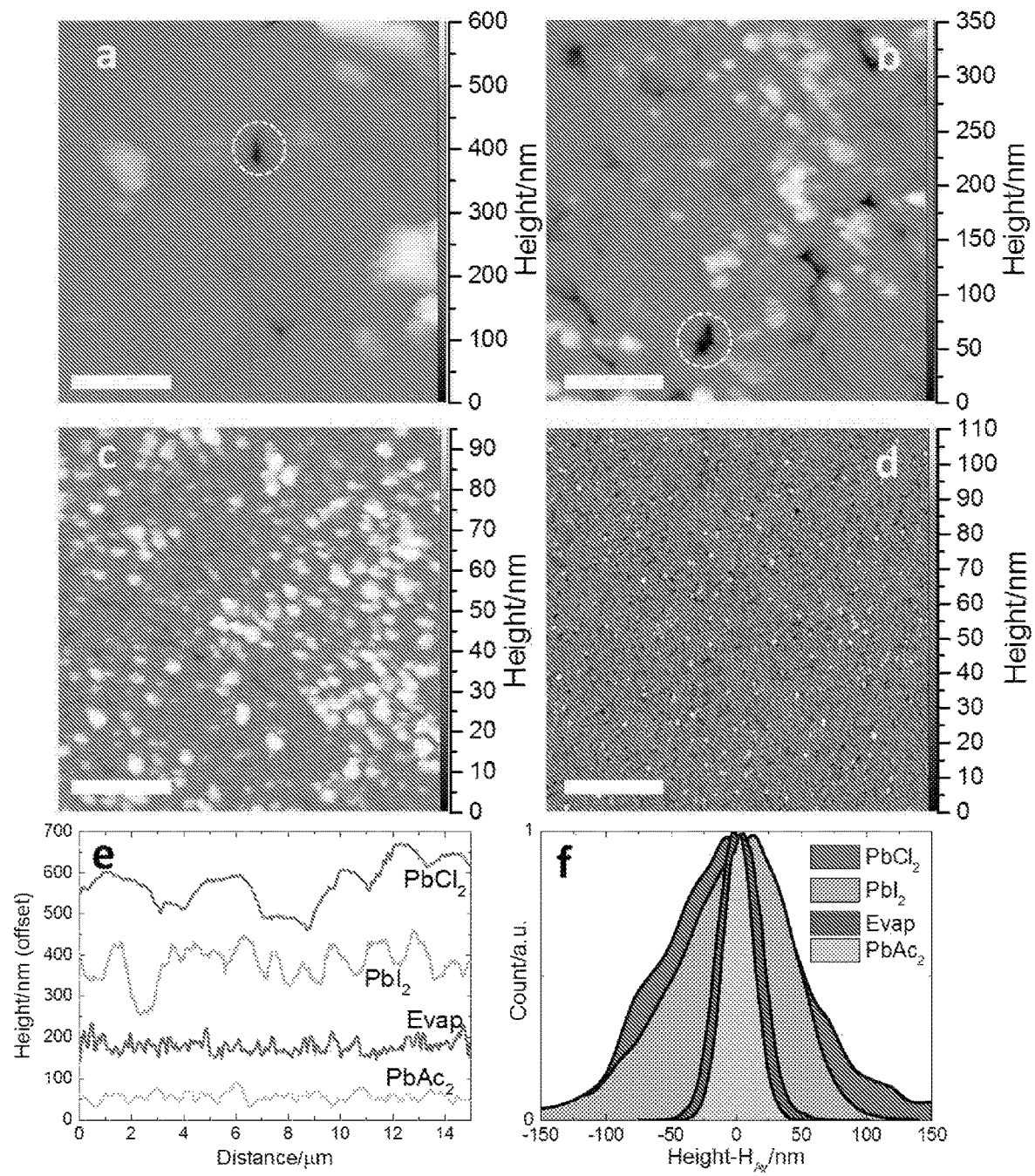
FIG. 8 shows AFM images of perovskite films deposited on a FTO/c-$TiO_2$ substrate by spin-coating from the three different perovskite precursor solutions, 3 molar equivalent of $CH_3NH_3I$ with one molar equivalent of $PbCl_2$ (a), $PbI_2$ (b), $PbAc_2$ (c), and vapour-deposited film based on $PbCl_2$ with $CH_3NH_3I$ (d). The scale bars are 4 μm. Examples of pin holes in perovskite films fabricated from $PbCl_2$ and $PbI_2$ precursor salts are circled. Line segments from each scan (e) and the height distribution (f) around the average height, $H_{Av}$, are also shown.

FIG. 8 shows AFM images of perovskite films deposited on a FTO/c-TiO$_2$ substrate by spin-coating from the three different lead precursors, PbCl$_2$ (a), PbI$_2$ (b), PbAc$_2$ (c), and vapor-deposited film based on PbCl$_2$ (d). The scale bars are 4 µm. Examples of pin holes in PbCl$_2$ and PbI$_2$ are circled, which are notably absent in the scan of PbAc$_2$. Line segments from each scan (e) and the height distribution (f) around the average height, H$_{Av}$, showing the exceptional smoothness of the PbAc$_2$ films. The roughness of the film fabricated via PbAc$_2$ is much smaller compared to other solution-processed films based on PbCl$_2$ and PbI$_2$ as is clearly shown both in the AFM line segments (FIG. 8e) and height distribution analysis (FIG. 8f). It is also worth noting the lack of pin-holes observed in PbAc$_2$ compared to both PbCl$_2$ and PbI$_2$. By choosing a sacrificial anion for the lead precursor, the smoothness of the solution-processed perovskite film is comparable to or even better than the vapor-deposited film based on PbCl$_2$ (16.2 nm, FIG. 5B) or PbI$_2$ (23.2 nm).

Device Performance

Figure 9:
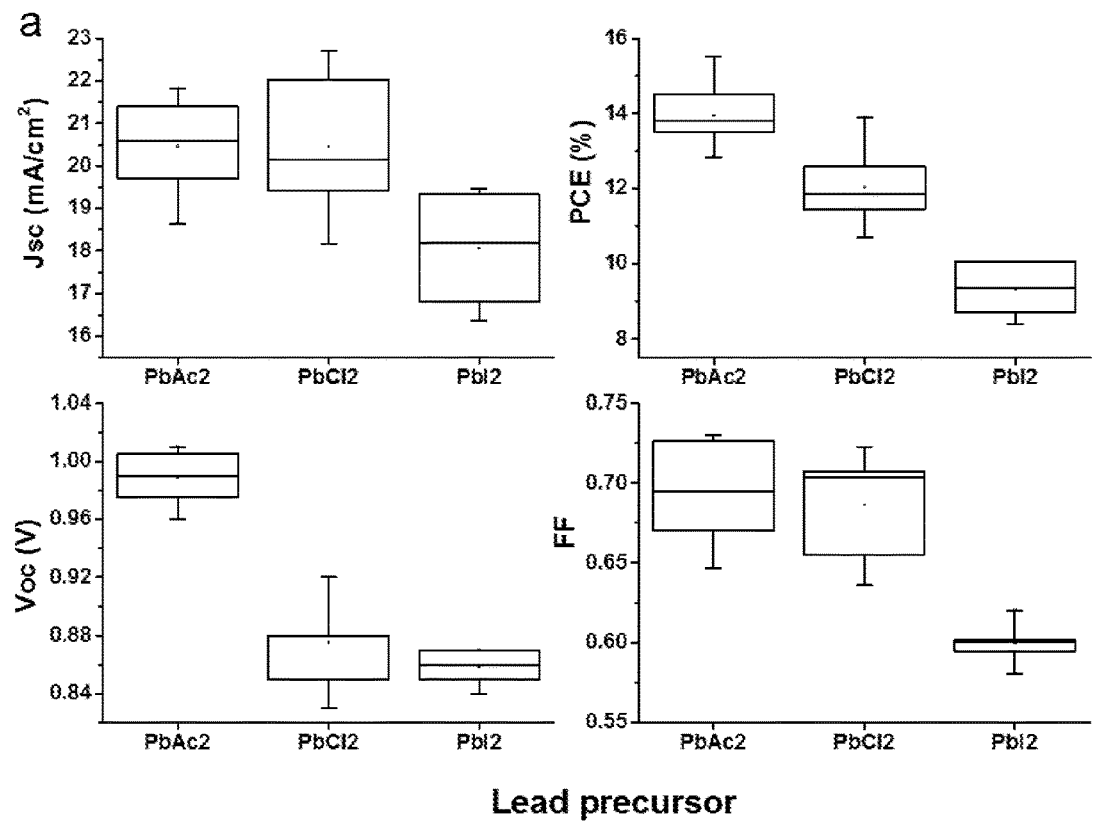
FIG. 9 planar heterojunction device performance at optimized conditions using different perovskite precursor solutions measured under simulated AM1.5 sunlight of 100 $mW/cm^2$ irradiance (left to right for each plot: $PbAc_2$, $PbCl_2$, $PbI_2$).
Figure 10:
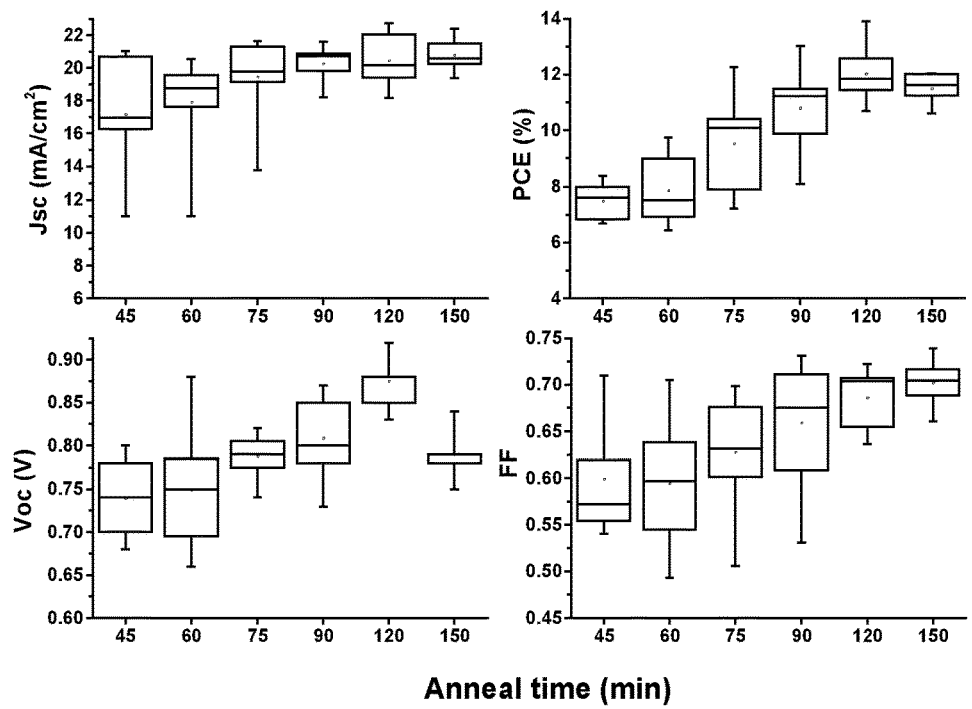
FIG. 10 shows planar heterojunction solar cell performance (anneal time dependence, best J-V) for a device comprising a layer of perovskite synthesised using $PbCl_2$ (anneal at 100° C.)
Figure 11:
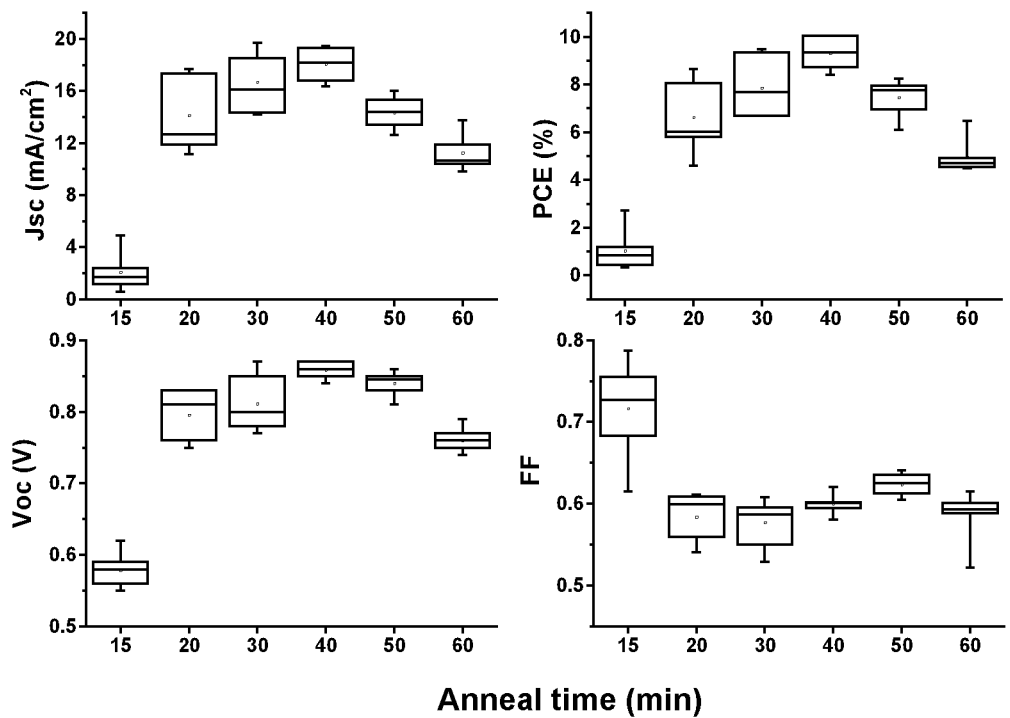
FIG. 11 shows planar heterojunction solar cell performance (anneal time dependence, best J-V) for a device comprising a layer of perovskite synthesised using $PbI_2$ (anneal at 150° C.).
Figure 12:
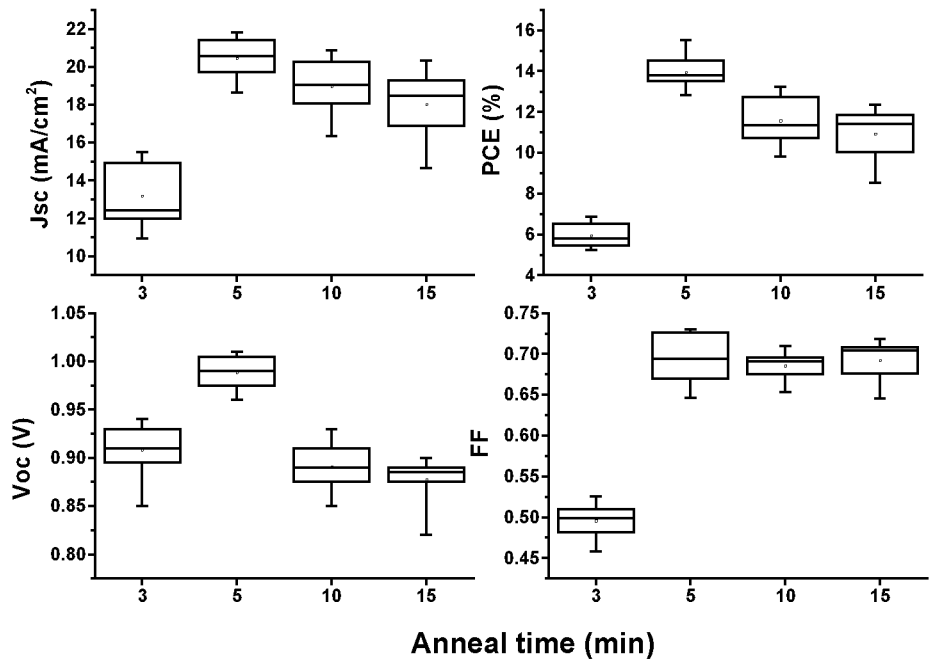
FIG. 12 shows planar heterojunction solar cell performance (anneal time dependence, best J-V) for a device comprising a layer of perovskite synthesised using $PbAc_2$ (anneal at 100° C.

The device characteristics of planar heterojunction devices produced by the method described above using PbCl$_2$, PbI$_2$ or PbAc$_2$ are shown in FIGS. 9 to 12. FIG. 9 compares performance of devices produced under optimised conditions from each of the three lead precursors.

The anneal time dependence of perovskite film made from PbCl$_2$ (FIG. 10), PbI$_2$ (FIG. 11) and PbAc$_2$ (FIG. 12) are shown. It is noted that no perovskite forms at 100° C. from PbI$_2$ precursor solution and anneal temperature was increased to 150° C. To achieve the best device performance, the perovskite films made from PbCl$_2$ and PbI$_2$ precursor solution need to be annealed for 2 h and 40 min, respectively. However, the anneal time is much shorter for that made from PbAc$_2$ (5 min), which saves time and energy for device making. The typical average device efficiency at optimized anneal time for perovskite from PbCl$_2$ (FIG. 10), PbI$_2$ (FIG. 11) and PbAc$_2$ (FIG. 12) are 12.0, 9.3 and 14.0%, respectively. Using PbAc$_2$ as precursor clearly achieves better device performance than known precursors such as PbI$_2$ and PbCl$_2$. The V$_{OC}$ of devices is in the sequence of PbCl$_2$<PbI$_2$<PbAc$_2$, which can be explained by the increased shunting pathway from spiro-OMeTAD with TiO$_2$ compact layer due to the porous perovskite film. This result is consistent with observation shown in the SEM images (FIGS. 5 and 6).

Figure 13:
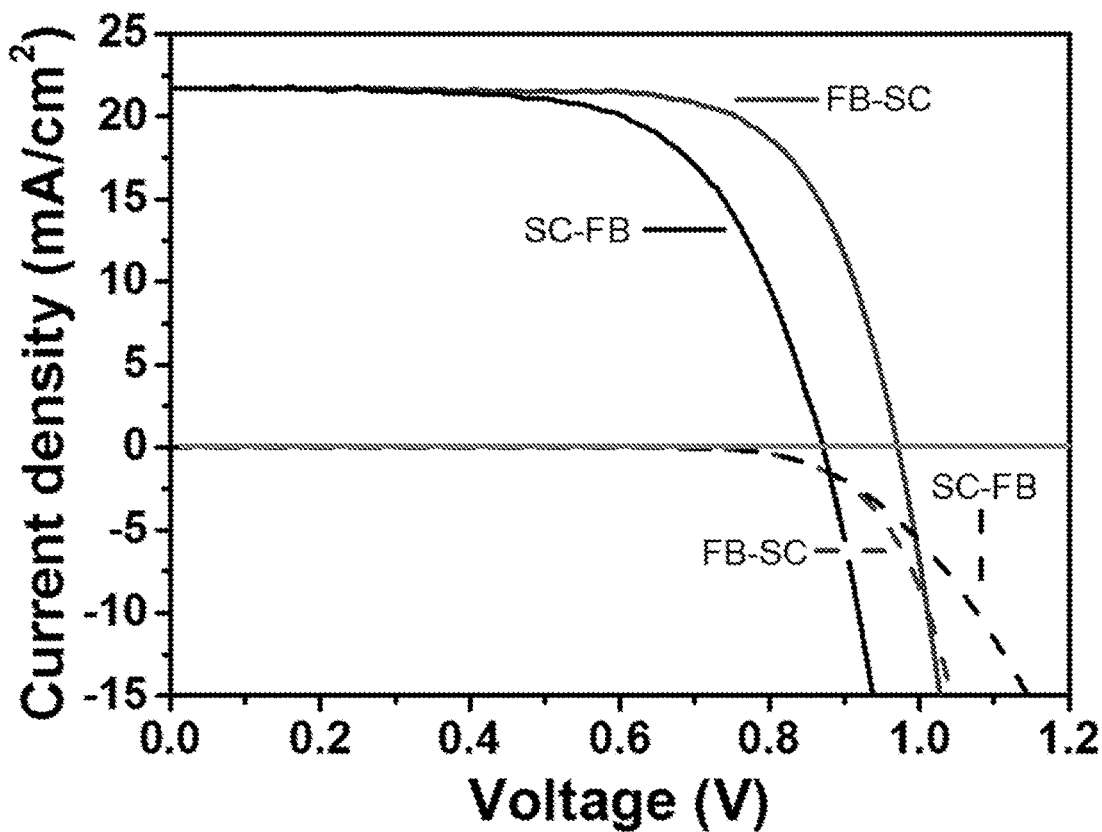
FIG. 13 shows the best J-V curve for a device produced using $PbAc_2$. A scan rate of 0.15 V/s was used (FB is forward bias, SC is short circuit).

The best J-V curve for PbAc$_2$ based device under simulated AM 1.5G (100 mW/cm$^2$) solar irradiation in the air is shown in FIG. 13 (characteristics in Table 1), exhibiting outstanding performance with J$_{SC}$=21.7 mA/cm$^2$, V$_{OC}$=0.97 V, fill factor (FF)=0.72, and PCE=15.2% scan from FB (full bias) to SC (short circuit), whilst with J$_{SC}$=21.7 mA/cm$^2$, V$_{OC}$=0.87 V, fill factor (FF)=0.65, and PCE=12.3% scan from SC to FB, so far among the highest efficiencies based on CH$_3$NH$_3$PbI$_3$ with planar structure.

TABLE 1

J-V characteristics for the device shown in FIG. 9

| | Jsc (mA/cm$^2$) | PCE (%) | Voc (V) | FF |
|---|---|---|---|---|
| FB-SC | 21.7 | 15.2 | 0.97 | 0.72 |
| SC-FB | 21.7 | 12.3 | 0.78 | 0.65 |

Figure 14:
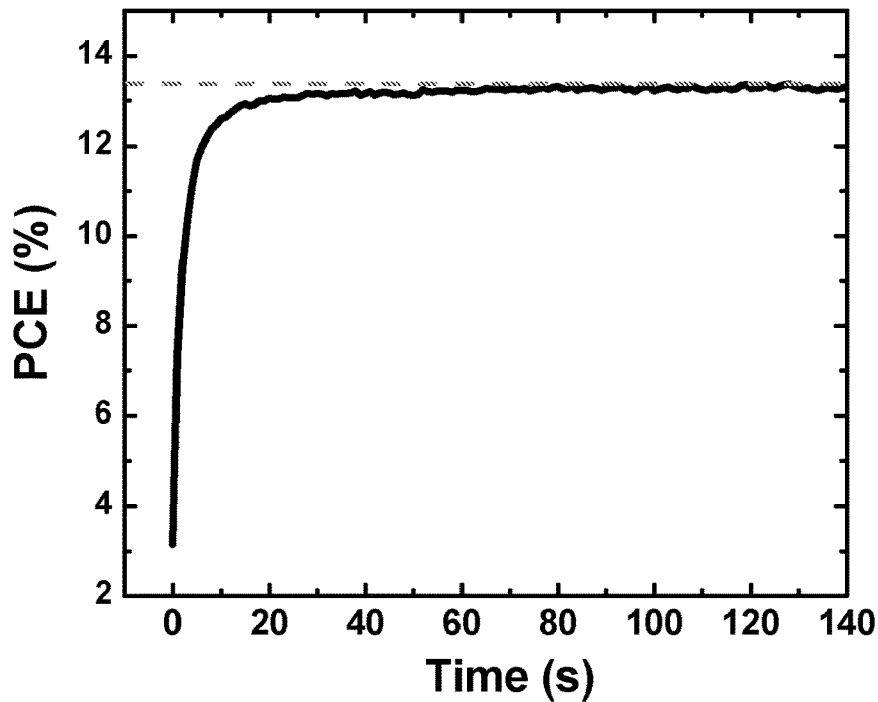
FIG. 14 shows the photocurrent density and power conversion efficiency as a function of time for the same cell as in FIG. 13 held close to 0.68 V forward bias.

The stabilized power output of the same cell is shown in FIG. 14 (photocurrent density and power conversion efficiency as a function of time for the same cell held close to 0.68 V forward bias).

To further understand the improvement in V$_{oc}$ when using PbAc$_2$ as the lead source to form the CH$_3$NH$_3$PbI$_3$ perovskite, EIS experiments were conducted near open-circuit and while under illumination. The spectra (not shown here) exhibited two semicircles, representing charge transfer at the perovskite/TiO$_2$ or spiro interfaces at high frequencies, always accompanied with a low frequency feature attributed to recombination.

Figure 15:
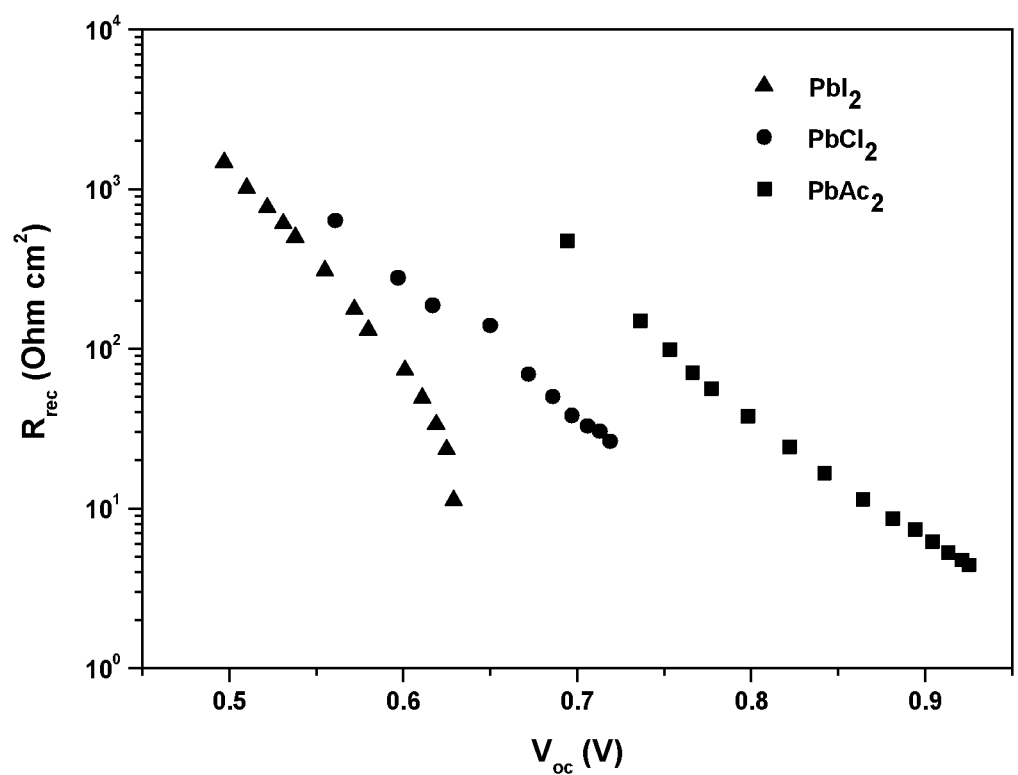
FIG. 15 shows recombination resistance ($R_{rec}$) plotted against open circuit voltage ($V_{oc}$) for devices producing using $PbAc_2$, $PbCl_2$ or $PbI_2$.

After fitting the data to a model, we determined the values for the charge recombination resistance (R$_{rec}$) and plotted R$_{rec}$ against V$_{oc}$ (FIG. 15). One could easily observe that recombination was severely suppressed (i.e. R$_{rec}$ was substantially increased) upon use of the lead acetate into the solution, in perfect line with the enhanced values of V$_{oc}$ observed in our solar cells. However, no significant differences were observed in the case of the lead triiodide perovskite based devices when employing PbI$_2$ or PbCl$_2$ as lead source. These results are also highly correlated with the photovoltage produced by the respective solar cells. The variation of V$_{oc}$ could be well correlated with different film morphology when the lead source is varied. For instance, it has been discussed earlier how the quick film formation driven by PbAc$_2$ creates a more dense film, leading to a better surface coverage that could prevent the solar cells suffering from recombination between the hole transport material and the electron collecting layer (c-TiO$_2$).

Example 2—Sacrificial Anion and Sacrificial Cation

In addition to having a sacrificial anion in the metal salt component to enable crystallisation at lower temperatures, some of the second cation (typically methylammonium for a methylammonium lead halide perovskite) may also be replaced in the precursor solution with a component that can be 'sacrificed' at a higher or lower temperature in order to affect crystallisation. This may enable even faster crystallisation, if a smaller or lighter cation is selected, which may be beneficial for processing or film uniformity, or slower crystallisation, which may enable the growth of larger, higher-quality crystals.

In the reaction proposed for crystallisation of a perovskite, taking the mixed halide methylammonium lead perovskite as an example: 3MAI+PbCl$_2$→MAPbI$_3$+2MACl it appears that upon full crystallisation of the MAPbI$_3$, MA+Cl will be lost, either as MACl or as its decomposition products. It has been shown in Example 1 that be replacing the Cl in the metal source with a more easily removed component, such as an acetate, the annealing process can be accelerated or performed at lower temperature.

Extrapolating this further, the inventors have found that replacing the second cation (e.g. MA) that is to be lost as the first volatile compound (e.g. MAAc) with a sacrificial cation the formation of the crystalline material is even more greatly accelerated. The reaction may therefore be:

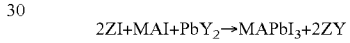

2ZI+MAI+PbY$_2$→MAPbI$_3$+2ZY where Z s the second sacrificial cation. If ZY is a more readily removed compound than the first volatile compound (e.g. MAAc), crystallisation will be accelerated.

As a first demonstration of this, the smaller organic ammonium iodide (NH$_4$I) as the ZI component has been employed. In combination with PbAc$_2$ as the lead source, NH$_4$Ac is the excess component which will be removed. This will be more easily removed than MAAc as ammonium is lighter than methylammonium.

Experimental

The precursor solution was formed by dissolving 0.88 M lead acetate trihydrate, 0.88 M methylammonium iodide and 1.76 M ammonium iodide in DMF. Methylammonium iodide was fabricated as described above and the other components were purchased commercially.

The precursor solution was spin-coated onto a cleaned glass substrate inside a nitrogen-filled glovebox, at 2000 rpm, 2 s ramp time, and 45 s hold time. During the spin-coating, the film turned dark brown indicating crystallisation of the MAPbI$_3$. It was not thermally annealed before characterisation.

Results

Results showed that this precursor composition, 2:1:1 by moles of NH$_4$I:MAI:PbAc$_2$, formed the MAPbI$_3$ perovskite very quickly upon spin-coating, at room temperature, with no need for thermal annealing at all. The material appears to be extremely smooth and have good surface coverage.

Figure 17:
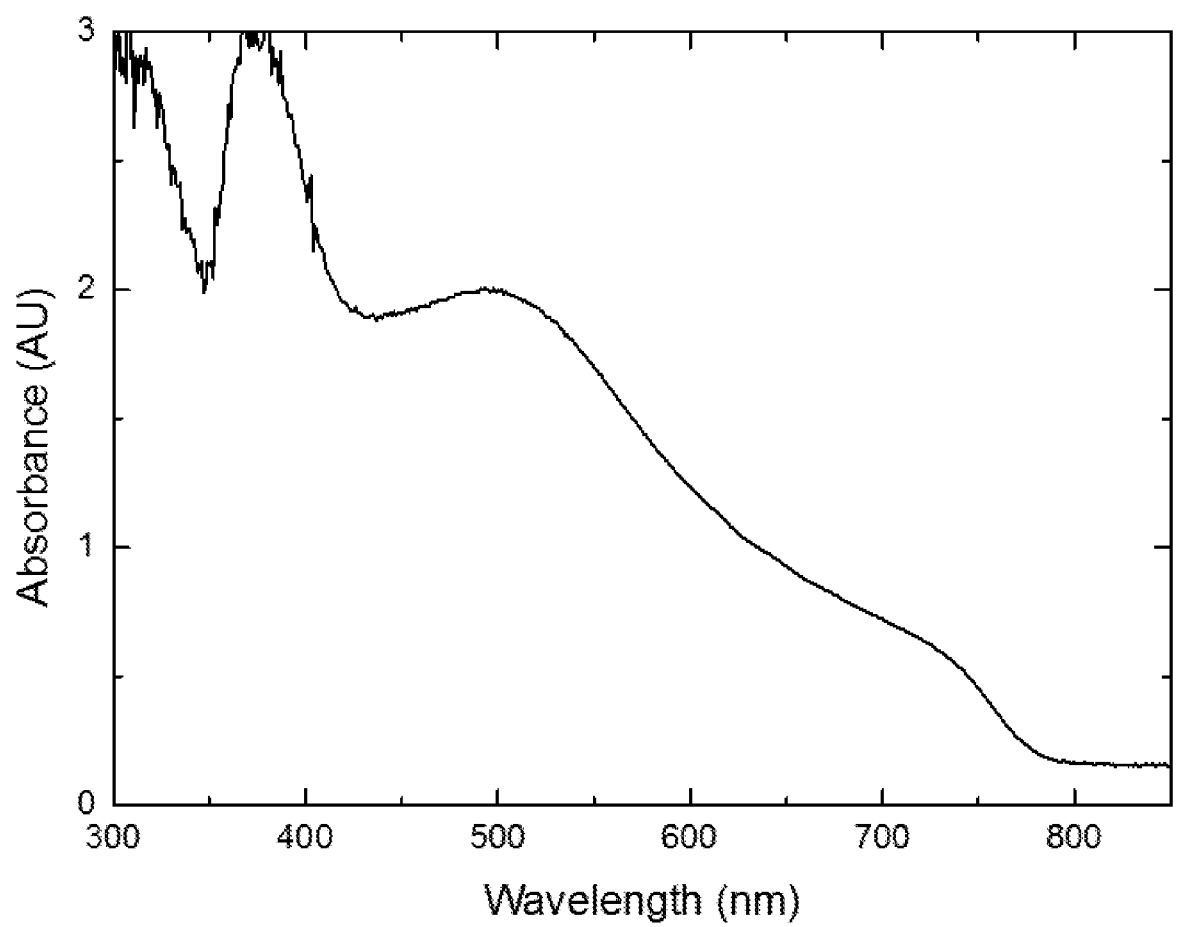
FIG. 17 shows the UV-Vis absorption spectrum of $MAPbI_3$ perovskite formed at room temperature by spin-coating a $NH_4I:CH_3NH_3I:PbAc_2$ precursor composition with a molar ratio of 2:1:1 of $NH_4I:CH_3NH_3I:PbAc_2$.

UV-Vis absorption spectrum of the perovskite formed at room temperature from spin-coating the NH$_4$I:MAI:PbAc$_2$ precursor is shown in FIG. 17. The absorption is in good agreement with standard data on the MAPbI$_3$ perovskite.

Figure 18:
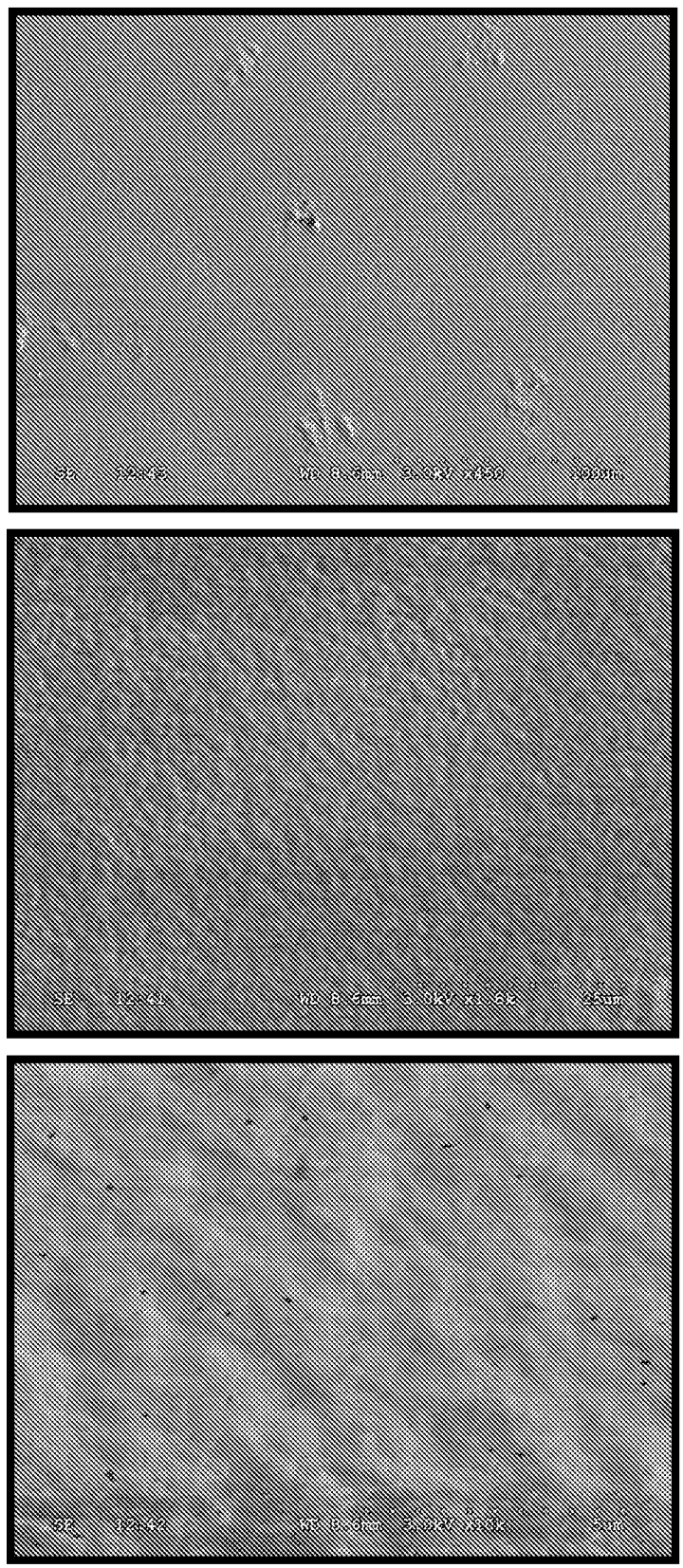
FIG. 18 shows SEM images of increasing magnification of the films produced by spin-coating a $NH_4I:CH_3NH_3I:PbAc_2$ ratio 2:1:1 precursor composition (with length scale of upper image 100 µm, length scale of middle image 25 µm, and length scale of lower image 5 µm).

SEM images of increasing magnification of the films produced are shown in FIG. 18 (with length scale of upper image 100 µm, length scale of middle image 25 µm, and length scale of lower image 5 μm). Good surface coverage and crystals of up to approximately 500 nm diameter are observed.

The invention claimed is:

1. A process for producing a semiconductor device, wherein the process comprises:
   (a) producing a layer of a crystalline material by a process comprising disposing on a substrate:
      a first precursor compound comprising a first cation and a sacrificial anion, wherein the first cation is a metal or metalloid cation and the sacrificial anion comprises two or more atoms; and
      a second precursor compound comprising a second anion and a second cation, wherein the second cation can together with the sacrificial anion form a first volatile compound; and
   (b) producing the semiconductor device, and wherein:
      the sacrificial anion is an organic anion;
      the second cation is an organic cation or $NH_4^+$, and
      the crystalline material comprises:
      a perovskite of formula (II):

$$[A][B][X]_3 \qquad (II)$$

wherein:
   [A] comprises the second cation, [B] comprises the first cation and [X] comprises the second anion, wherein [A] is at least one monocation; [B] is at least one metal or metalloid dication; and [X] is at least one halide anion;
   or
   a hexahalometallate of formula (III):

$$[A]_2[M][X]_6 \qquad (III)$$

wherein:
   [A] comprises the second cation, [M] comprises the first cation and [X] comprises the second anion, wherein [A] is at least one monocation; [M] is at least one metal or metalloid tetracation; and [X] is at least one halide anion;
   or
   a compound of formula (V):

$$[A]_2[B][X]_4 \qquad (V)$$

wherein:
   [A] comprises the second cation, [B] comprises the first cation and [X] comprises the second anion, wherein [A] is at least one monocation; [B] is at least one metal or metalloid dication; and [X] is at least one halide anion.

2. A process according to claim 1, wherein the layer of the crystalline material comprises a wt % less than or equal to 5 wt % of the sacrificial anion.

3. A process according to claim 1, wherein the sacrificial anion is an organic anion of formula $RCOO^-$, $ROCOO^-$, $RSO_3^-$, $ROP(O)(OH)O^-$ or $RO^-$, and
   R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl.

4. A process according to claim 1, wherein the sacrificial anion is formate, acetate, propanoate, butanoate, pentanoate or benzoate.

5. A process according to claim 1, wherein the metal or metalloid cation is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$.

6. A process according to claim 1, wherein the first precursor compound is a compound of formula $[B][Y]_2$ or $[M][Y]_4$, wherein [B] is said first cation which is a metal or metalloid dication, [M] is said first cation which is a metal or metalloid tetracation, and [Y] is said sacrificial anion.

7. A process according to claim 1, wherein the first precursor compound is lead (II) acetate, lead (II) formate, lead (II) propanoate, tin (II) formate, tin (II) acetate or tin (II) propanoate.

8. A process according to claim 1, wherein the second cation is $(NR^1R^2R^3R^4)^+$, $(R^1R^2N=CR^3R^4)^+$, $(R^1R^2N=C(R^5)=NR^3R^4)^+$ or $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group.

9. A process according to claim 1, wherein the second cation is $(R^1NH_3)^+$, $(NR^2_4)^+$ or $(H_2N-C(R^1)=NH_2)^+$, wherein $R^1$ is H or an unsubstituted $C_{1-6}$ alkyl group and each $R^2$ is an unsubstituted $C_{1-6}$ alkyl group.

10. A process according to claim 1, wherein the second anion is a halide anion or a chalcogenide anion.

11. A process according to claim 1, wherein the second precursor compound is a compound of formula [A][X], wherein [A] is said second cation and [X] is said second anion, wherein the second anion is a halide anion.

12. A process according to claim 1, wherein the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)Cl$, $(H_2N-C(H)=NH_2)Br$ and $(H_2N-C(H)=NH_2)I$.

13. A process according to claim 1 wherein the crystalline material comprises a compound comprising: said first cation which is a metal or metalloid cation; said second cation, wherein the second cation is an organic cation; and the second anion which is a halide anion.

14. A process according to claim 1, wherein the crystalline material comprises a perovskite of formula (II) and [A] is at least one of a metal or metalloid monocation or an organic monocation.

15. A process according to claim 1, wherein the crystalline material comprises $CH_3NH_3PbI_3$, $CH_3NH_3PbBr_3$, $CH_3NH_3PbCl_3$, $CH_3NH_3PbF_3$, $CH_3NH_3PbBrxI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, or $CH_3NH_3CuF_{3-x}Cl_x$ where $X_1S$ from 0 to 3.

16. A process according to claim 1, wherein the first volatile compound has a vapour pressure of greater than or equal to 500 Pa at 20° C. or a dissociation pressure of greater than or equal to 500 Pa at 20° C.

17. A process according to claim 1, wherein the first volatile compound has an initial thermal decomposition temperature where 5 wt % weight is lost of less than or equal to 200° C.

18. A process according to claim 1, wherein the first volatile compound is a compound of formula [A][Y], wherein

[A] is said second cation, wherein the second cation is $(NR^1R^2R^3R^4)^+$, $(R^1R^2N=CR^3R^4)^+$, $(R^1R^2N-C(R^5)=NR^3R^4)^+$ or $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group, and

[Y] is said sacrificial anion, wherein the sacrificial anion is an anion of formula $RCOO^-$, $ROCOO^-$, $RSO_3^-$, $ROP(O)(OH)O^-$ or $RO^-$, and R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl.

19. A process according to claim 1, wherein the first volatile compound is a compound of formula [A][Y], wherein

[A] is said second cation, wherein the second cation is $(R^1NH_3)^+$, $(NR^24)^+$ or $(H_2N-C(R^1)=NH_2)^+$, wherein $R^1$ is H or an unsubstituted $C_{1-6}$ alkyl group and each $R^2$ is independently an unsubstituted $C_{1-6}$ alkyl group, and

[Y] is said sacrificial anion, wherein the sacrificial anion is an anion of formula $RCOO^-$, wherein R is H or unsubstituted $C_{1-6}$ alkyl.

20. A process according to claim 1, wherein the ratio by amount (first precursor compound):(second precursor compound) is from 1:0.9 to 1:6.

21. A process according to claim 1, wherein disposing the first and second precursor compounds on the substrate comprises disposing a composition on the substrate, wherein the composition comprises the first and second precursor compounds and a solvent.

22. A process according to claim 21, wherein the solvent comprises one or more of dimethyl formamide (DMF) and, dimethyl sulfoxide (DMSO).

23. A process according to claim 1, wherein the process further comprises heating the disposed first and second precursor compounds to a temperature of from 50° C. to 200° C.

24. A process according to claim 1, wherein the process comprises:
(a) disposing on the substrate a composition comprising a solvent, said first precursor compound and said second precursor compound; and
(b) removing the solvent;
wherein
the solvent is a polar aprotic solvent,
the first precursor compound is lead (II) acetate, lead (II) formate, lead (II) propanoate, tin (II) formate, tin (II) acetate or tin (II) propanoate, preferably lead (II) acetate and the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ or $(H_2N-C(H)=NH_2)I$, preferably $(CH_3NH_3)I$.

25. A process according to claim 1, wherein the process comprises disposing on the substrate:
said first precursor compound;
said second precursor compound; and
a third precursor compound comprising a sacrificial cation, wherein the sacrificial cation comprises two or more atoms and has a lower molecular weight than the second cation, and wherein the sacrificial cation can together with the sacrificial anion form a second volatile compound.

26. A process according to claim 25 wherein,
the second precursor compound comprises said second cation and the second anion which is a halide or chalcogenide anion, and
the third precursor compound comprises said sacrificial cation and the same halide or chalcogenide anion as is the second anion in the second precursor compound.

27. A process according to claim 25, wherein the third precursor compound is $NH_4F$, $NH_4Cl$, $NH_4Br$ or $NH_4I$.

28. A process according to claim 25 wherein the ratio by amount (first precursor compound):(second precursor compound):(third precursor compound) is from 1:0.9:1 to 1:3:4.

29. A process according to claim 25, wherein the process comprises:
(a) disposing on the substrate a composition comprising a solvent, said first precursor compound, said second precursor compound and said third precursor compound; and
(b) removing the solvent;
wherein
the solvent is a polar aprotic solvent,
the first precursor compound is lead (II) acetate, lead (II) formate, lead (II) propanoate, tin (II) formate, tin (II) acetate or tin (II) propanoate, preferably lead (II) acetate,
the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ or $(H_2N-C(H)=NH_2)I$, preferably $(CH_3NH_3)I$, and
the third precursor compound is $NH_4F$, $NH_4Cl$, $NH_4Br$ or $NH_4I$.

30. A process according to claim 1 which further comprises disposing on the substrate an auxiliary metal compound, wherein the auxiliary metal compound comprises:
an auxiliary cation which is the same cation as said first cation; and
an auxiliary anion which is the same anion as said second anion.

31. A process according to claim 30, wherein the auxiliary metal compound is a compound of formula $[B][X]_2$ or $[M][X]_4$, wherein [B] is said auxiliary cation which is the same as said first cation which is a metal or metalloid dication [M] is said auxiliary cation which is the same as said first cation which is a metal or metalloid tetracation, and [X] is said auxiliary anion which is the same as said second anion which is a halide anion.

32. A process for producing a layer of a crystalline material, wherein the process comprises disposing on a substrate:
a first precursor compound comprising a first cation and a sacrificial anion, wherein first cation is a metal or metalloid cation and the sacrificial anion comprises two or more atoms; and
a second precursor compound comprising a second anion and a second cation, wherein the second cation can together with the sacrificial anion form a first volatile, compound,
wherein:
the sacrificial anion is an organic anion;
the second cation is an organic cation or NH4+;

the substrate comprises: a layer of a first electrode material; or a layer of an n-type semiconductor; or a layer of a p-type semiconductor; and the crystalline material comprises:

a perovskite of formula (II):

$$[A][B][X]_3 \qquad (II)$$

wherein:

[A] comprises the second cation, [B] comprises the first cation and [X] comprises the second anion, wherein [A] is at least one monocation; [B] is at least one metal or metalloid dication; and [X] is at least one halide anion; or a hexahalometallate of formula (III):

$$[A]_2[M][X]_6 \qquad (III)$$

wherein:

[A] comprises the second cation, [M] comprises the first cation and [X] comprises the second anion, wherein [A] is at least one monocation; [M] is at least one metal or metalloid tetracation; and [X] is at least one halide anion, or a compound of formula (V):

$$[A]_2[B][X]_4 \qquad (V)$$

wherein:

[A] comprises the second cation, [B] comprises the first cation and [X] comprises the second anion, wherein [A] is at least one monocation; [B] is at least one metal or metalloid dication and [XI is at least one halide anion.

* * * * *

UNITED STATES PATENT AND TRADEMARK OFFICE
CERTIFICATE OF CORRECTION

PATENT NO.         : 10,622,162 B2
APPLICATION NO.    : 15/502082
DATED              : April 14, 2020
INVENTOR(S)        : Henry James Snaith et al.

It is certified that error appears in the above-identified patent and that said Letters Patent is hereby corrected as shown below:

In the Claims

Column 43, Claim 51, Line 29, "[XI" should be --[X]--.

Signed and Sealed this
Twenty-first Day of July, 2020

Andrei Iancu
*Director of the United States Patent and Trademark Office*